(12) United States Patent
Carvajal et al.

(10) Patent No.: US 9,745,833 B2
(45) Date of Patent: Aug. 29, 2017

(54) OPTIMIZING OIL RECOVERY AND REDUCING WATER PRODUCTION IN SMART WELLS

(71) Applicant: Landmark Graphics Corporation, Houston, TX (US)

(72) Inventors: Gustavo Carvajal, Katy, TX (US); Ian Boisvert, Cochrane (CA); Steven Knabe, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 141 days.

(21) Appl. No.: 14/768,838

(22) PCT Filed: Mar. 31, 2015

(86) PCT No.: PCT/US2015/023704
§ 371 (c)(1),
(2) Date: Aug. 19, 2015

(87) PCT Pub. No.: WO2015/153680
PCT Pub. Date: Oct. 8, 2015

(65) Prior Publication Data
US 2016/0273315 A1    Sep. 22, 2016

Related U.S. Application Data

(60) Provisional application No. 61/973,680, filed on Apr. 1, 2014.

(51) Int. Cl.
*E21B 41/00* (2006.01)
*E21B 43/00* (2006.01)
(Continued)

(52) U.S. Cl.
CPC .......... *E21B 41/0092* (2013.01); *E21B 34/06* (2013.01); *E21B 43/00* (2013.01);
(Continued)

(58) Field of Classification Search
CPC ...... E21B 41/0092; E21B 34/06; E21B 43/00; E21B 43/12; E21B 43/14; E21B 47/00;
(Continued)

(56) References Cited

U.S. PATENT DOCUMENTS

2007/0179768 A1* 8/2007 Cullick ................... E21B 43/00
703/10
2010/0071897 A1* 3/2010 Liu .......................... E21B 43/00
166/250.01

(Continued)

FOREIGN PATENT DOCUMENTS

WO         2013052731 A1    4/2013
WO    WO 2013052731    *    4/2013  ............... G01V 1/40

OTHER PUBLICATIONS

Commissioner; International Search Report and the Written Opinion of the International Searching Authority; PCT/US15/23704; dated Mar. 31, 2015; 9 pgs.; ISA/KR.
(Continued)

*Primary Examiner* — Yong-Suk (Philip) Ro
(74) *Attorney, Agent, or Firm* — Polsinelli PC

(57) ABSTRACT

A method and non-transitory program carrier device tangibly carrying computer executable instructions for adjusting downhole valve settings in order to optimize oil recovery and reduce water production from a well. The method and non-transitory program carrier device are particularly advantageous in wells with intelligent completions that are often referred to as smart wells. In the oil and gas industry, an Internal Control Valve (ICV) is an important tool for both reactive and proactive approaches to adjust ICV settings to improve oil recovery.

18 Claims, 21 Drawing Sheets

(51) Int. Cl.
E21B 43/12 (2006.01)
E21B 43/14 (2006.01)
E21B 34/06 (2006.01)
E21B 47/00 (2012.01)
G06F 17/11 (2006.01)
G06F 17/50 (2006.01)
E21B 33/12 (2006.01)
E21B 43/20 (2006.01)
E21B 47/06 (2012.01)

(52) U.S. Cl.
CPC .............. *E21B 43/12* (2013.01); *E21B 43/14* (2013.01); *E21B 47/00* (2013.01); *G06F 17/11* (2013.01); *G06F 17/5009* (2013.01); *E21B 33/12* (2013.01); *E21B 43/128* (2013.01); *E21B 43/20* (2013.01); *E21B 47/06* (2013.01); *E21B 47/065* (2013.01)

(58) Field of Classification Search
CPC ........ E21B 33/12; E21B 43/128; E21B 43/20; E21B 47/06; E21B 47/065; G06F 17/11; G06F 17/5009
See application file for complete search history.

(56) References Cited

U.S. PATENT DOCUMENTS

| 2010/0132450 | A1* | 6/2010 | Pomerantz | G01N 33/2823 73/152.28 |
|---|---|---|---|---|
| 2013/0005615 | A1* | 1/2013 | Henaut | C09K 8/588 507/211 |

OTHER PUBLICATIONS

Zakirov, Iskander S., Aanonsen,Ivar Sigurd, Zakirov, Ernest, S., Palatnik, Boris M.; Optimizing Reservoir Performance by Automatic Allocation of Well Rates; dated Sep. 3, 1996; 10 pages; Leoben, Austria.

G.A. Carvajal, F. Wang, C. Lopez, A.S. Cullick, A. Al-Jasmi, and H.K. Goel; Optimizing the Waterflooding Performance of a Carbonate Reservoir with Internal Control Values; SPE 164814, dated Jun. 10, 2013; 9 pages; London; United Kingdom.

D. Ranjan, G. A. Carvajal, H. Khan, R. Vellankki, L. Saputelli, F. MD Adan, M. Villamizar, S. Knabe, and J. Rodriguez, A. Al-Jasmi, H. Nasr, B. Al-Saad and A. Pattak; Automated Workflows to Monitor, Diagnosis, Optimize, and Perform Multi-Scenario Forecasts of Waterfloding in Low-Permeability Carbonate Reservoirs (a KwIDF Project); SPE 167398-MS; Dated Oct. 28, 2013; 15 pages; Dubai; UAE.

Marco R. Theile and Rod P. Batycky; Water Injection Optimization Using a Streamline-Based Workflow; SPE 84080; dated Oct. 5, 2003; 6 pages; Denver; Colorado.

A. A Jayi, M. Konopczynski and O. Tesaker; Application of Intelligent Completions to Optimize Waterflood Process on a Mature North Sea Field: A Case Study; SPE 101935; dated Aug. 31, 2006; 8 pages; Cancun; Mexico.

D.R. Brouwer and J.D. Jansen; Dynamic Optimization of Water Flooding with Smart Wells Using Optimal Control Theory; SPE 78278; dated Oct. 29, 2002; 14 pages; Aberdeen, Scottland; U.K.

A.S. Cullick and Tor Sukkestad; Smart Operations with Intelligent Well Systems; SPE 126246; dated Mar. 23, 2010; 17 pages; Utrecht, The Netherlands.

F.T. Al-Khelaiwi, V.M. Birchenko, M.R. Konopczynski and D.R. Davies; Advanced Wells: A Comprehensive Approach to the Selection Between Passive and Active Inflow Control Completions; IPTC 12145; dated Dec. 3, 2008; 22 pages; Kuala Lumpur, Malaysia.

L. Saputelli, K. Ramirez, J. Chegin and S. Cullick; Waterflood Recovery Optimization Using Intelligent Wells and Decision Analysis; SPE 120509; dated May 31, 2009; 15 pages; Cartagena, Columbia.

* cited by examiner

OPTIMIZING OIL RECOVERY AND REDUCING WATER PRODUCTION IN SMART WELLS

CROSS-REFERENCE TO RELATED APPLICATIONS

This Application claims priority from PCT Patent Application Serial No. PCT/US15/23704, filed on Mar. 31, 2015, which claims priority from U.S. Provisional Patent Application Ser. No. 61/973,680, filed on Apr. 1, 2014, which are incorporated herein by reference.

STATEMENT REGARDING FEDERALLY SPONSORED RESEARCH

Not applicable.

FIELD OF THE DISCLOSURE

The present disclosure generally relates to systems and methods for optimizing oil recovery and reducing water production in wells with intelligent completions that are often referred to as smart wells. More particularly, the present disclosure relates to optimizing oil recovery and reducing water production in smart wells using integrated reactive/proactive optimization to determine optimal downhole valve settings.

BACKGROUND

In the oil and gas industry, an Interval Control Valve (ICV) is an important tool for managing production challenges from smart wells that use ICVs and real-time sensors for acquiring both down-hole and surface data, such as localized water or gas breakthrough, particularly in multi-lateral wells and horizontal wells with open-hole completions. The application of smart wells with real-time surveillance does not end in monitoring and diagnosing well performance and generating ICV settings to improve oil recovery, which is commonly referred to as a reactive approach to oil recovery optimization. In recent decades, for example, operators often have debated choosing between the reactive approach and a proactive approach that involves adjusting ICV settings based on forecasted results. The proactive approach is followed by most reservoir engineers who are the custodians of any remaining reserves. The reactive approach is followed by most production engineers who seek to increase daily production. The proactive approach at the field level is the most difficult to justify without clear evidence that it will work. If the reservoir model is not very well history-matched and predictions do not reproduce what the wells are doing today, the reactive approach is preferred. However, the reactive approach sometimes produces undesirable results, such as delayed water or gas influx by choking back part of a well, which can result in water or gas breakthrough and bypassing oil reserves.

BRIEF DESCRIPTION OF THE DRAWINGS

The present disclosure is described below with references to the accompanying drawings in which like elements are referenced with like reference numerals, and in which:

FIG. 1 is an exemplary well completion diagram illustrating a horizontal, section of the well isolated with five expandable packers and ICVs.

DETAILED DESCRIPTION OF THE PREFERRED EMBODIMENTS

Figure 1A:
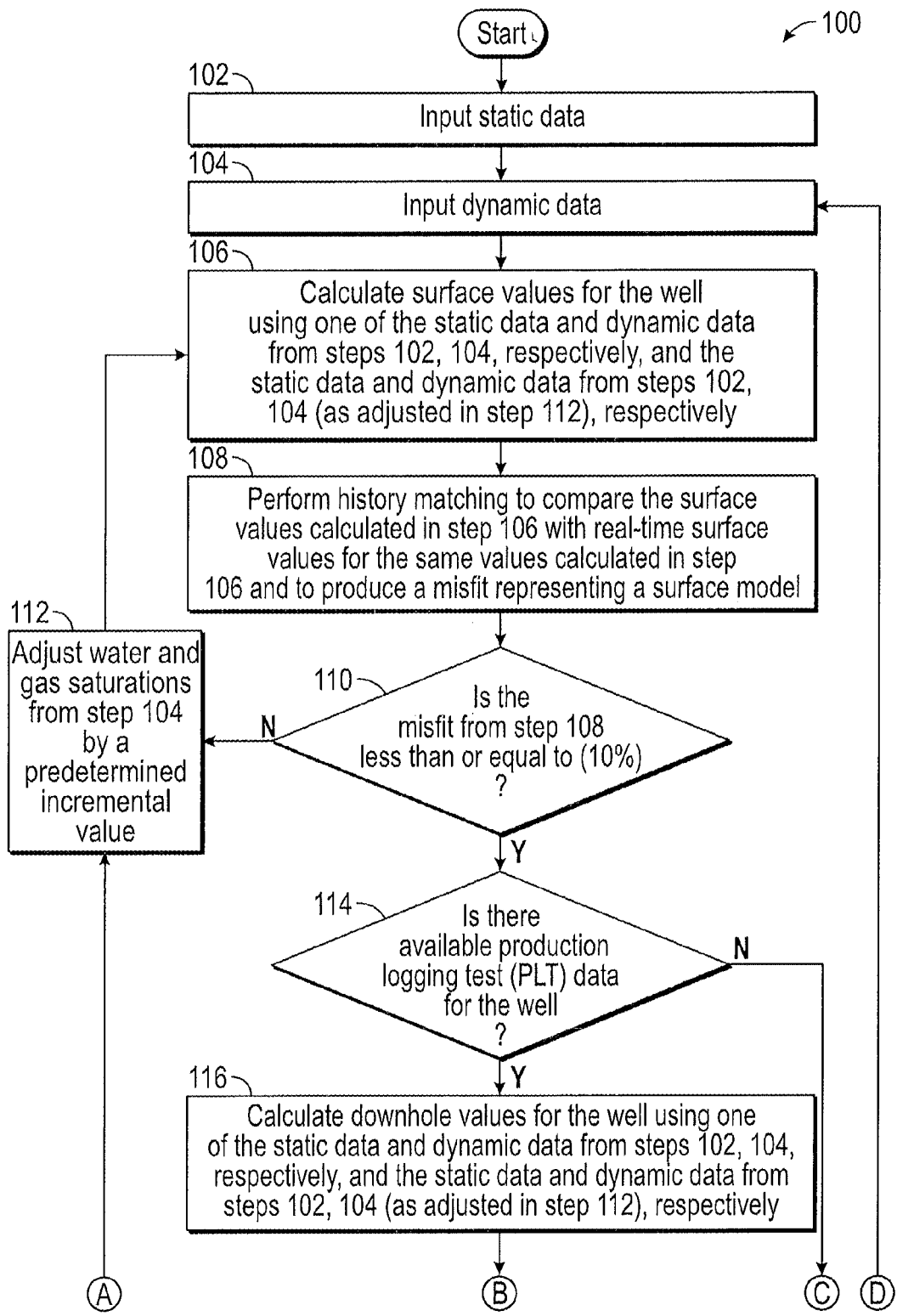
FIGS. 1A-1C. are a flow diagram illustrating one embodiment of a method for implementing the present disclosure.

The present disclosure overcomes one or more deficiencies in the prior art by providing systems and methods for optimizing oil recovery and reducing water production in smart wells using integrated reactive/proactive optimization to determine optimal downhole valve settings.

In one embodiment, the present disclosure includes a method for optimizing oil recovery and reducing water production in a well, which comprises: a) calculating surface values for respective parameters of the well using static data for the well and one of dynamic data for the well and adjusted dynamic data for the well; b) performing history matching to compare the calculated surface values with real-time surface values for the respective parameters and to produce a misfit representing a surface model; c) adjusting one or more values in the dynamic data, which represents the adjusted dynamic data, and repeating steps a)-c) until the misfit representing the surface model is <=10%; d) calculating an optimal downhole valve setting for each completion zone in the well using a simulation and at least one of the surface model and a downhole model; e) updating a 3D grid simulation model using the adjusted dynamic data and a current downhole valve setting for each completion zone in the well; f) calculating a cumulative oil value over a predetermined forecasted time period at a predetermined forecasted time interval using the updated 3D grid simulation model and the current downhole valve setting for each completion zone in the well; g) calculating a maximum cumulative oil value over the predetermined forecasted time period at the predetermined forecasted time interval using the updated 3D grid simulation model and a new optimal downhole valve setting for each completion zone in the well that is based on a simulation to maximize the cumulative oil value; and h) using one of the optimal downhole valve setting for each completion zone in the well and the new optimal downhole valve setting for each completion zone in the well to adjust the current downhole valve setting for each completion zone in the well.

In another embodiment, the present disclosure includes a non-transitory program carrier device tangibly carrying computer-executable instructions for optimizing oil recovery and reducing water production in a well, the instructions being executable to implement: a) calculating surface values for respective parameters of the well using static data for the well and one of dynamic data for the well and adjusted dynamic data for the well; b) performing history matching to compare the calculated surface values with real-time surface values for the respective parameters and to produce a misfit representing a surface model; c) adjusting one or more values in the dynamic data, which represents the adjusted dynamic data, and repeating steps a)-c) until the misfit representing the surface model is <=10%; d) calculating an optimal downhole valve setting for each completion zone in the well using a simulation and at least one of the surface model and a downhole model; e) updating a 3D grid simulation model using the adjusted dynamic data and a current downhole valve setting for each completion zone in the well; f) calculating a cumulative oil value over a predetermined forecasted time period at a predetermined forecasted time interval using the updated 3D grid simulation model and the current downhole valve setting for each completion zone in the well; g) calculating a maximum cumulative oil value over the predetermined forecasted time period at the predetermined forecasted time interval using the updated 3D grid simulation model and a new optimal downhole valve setting for each completion zone in the well that is based on a simulation to maximize the cumulative oil value; and h) using one of the optimal downhole valve setting for each completion zone in the well and the new optimal downhole valve setting for each completion zone in the well to adjust the current downhole valve setting for each completion zone in the well.

In yet another embodiment, the present disclosure includes a non-transitory program carrier device tangibly carrying computer-executable instructions for optimizing oil recovery and reducing water production in a well, the instructions being executable to implement: a) calculating surface values for respective parameters of the well using static data for the well and one of dynamic data for the well and adjusted dynamic data for the well; b) performing history matching to compare the calculated surface values with real-time surface values for the respective parameters and to produce a misfit representing a surface model; c) adjusting one or more values in the dynamic data, which represents the adjusted dynamic data, and repeating steps a)-c) until the misfit representing the surface model is <=10%; d) calculating an optimal downhole valve setting for each completion zone in the well using a simulation and at least one of the surface model and a downhole model; e) updating a 3D grid simulation model using the adjusted dynamic data and a current downhole valve setting for each completion zone in the well; f) calculating a cumulative oil value over a predetermined forecasted time period at a predetermined forecasted time interval using the updated 3D grid simulation model and the current downhole valve setting for each completion zone in the well; and g) calculating a maximum cumulative oil value over the predetermined forecasted time period at the predetermined forecasted time interval using the updated 3D grid simulation model and a new optimal downhole valve setting for each completion zone in the well that is based on a simulation to maximize the cumulative oil value.

The subject matter of the present disclosure is described with specificity; however, the description itself is not intended to limit the scope of the disclosure. The subject matter thus, might also be embodied in other ways, to include different steps or combinations of steps similar to the ones described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the present disclosure may be applied in the oil and gas industry, it is not limited thereto and may also be applied in other industries such as, for example, water or coal exploration to achieve similar results.

Method Description

Figure 1B:
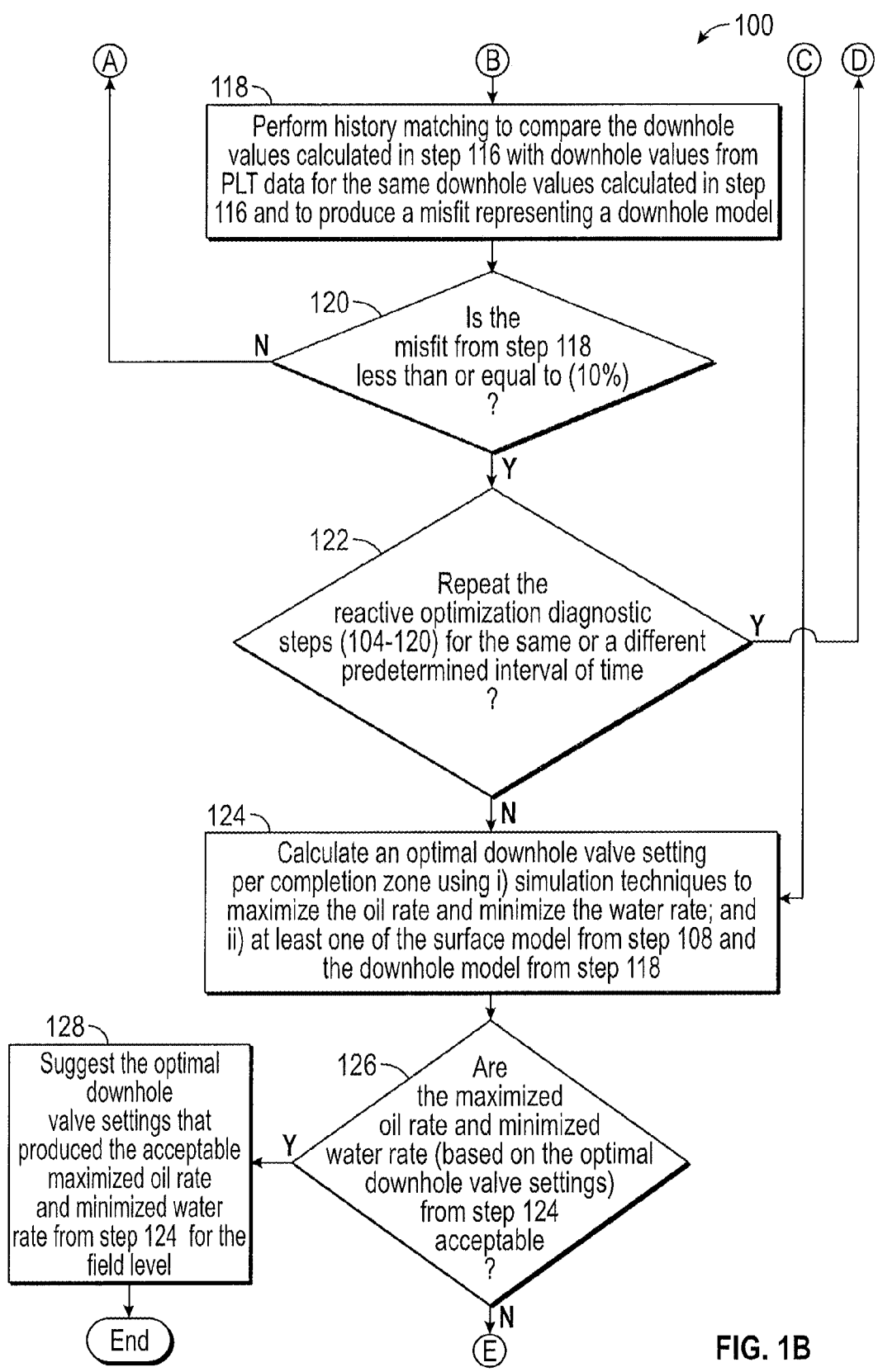
Figure 1C:
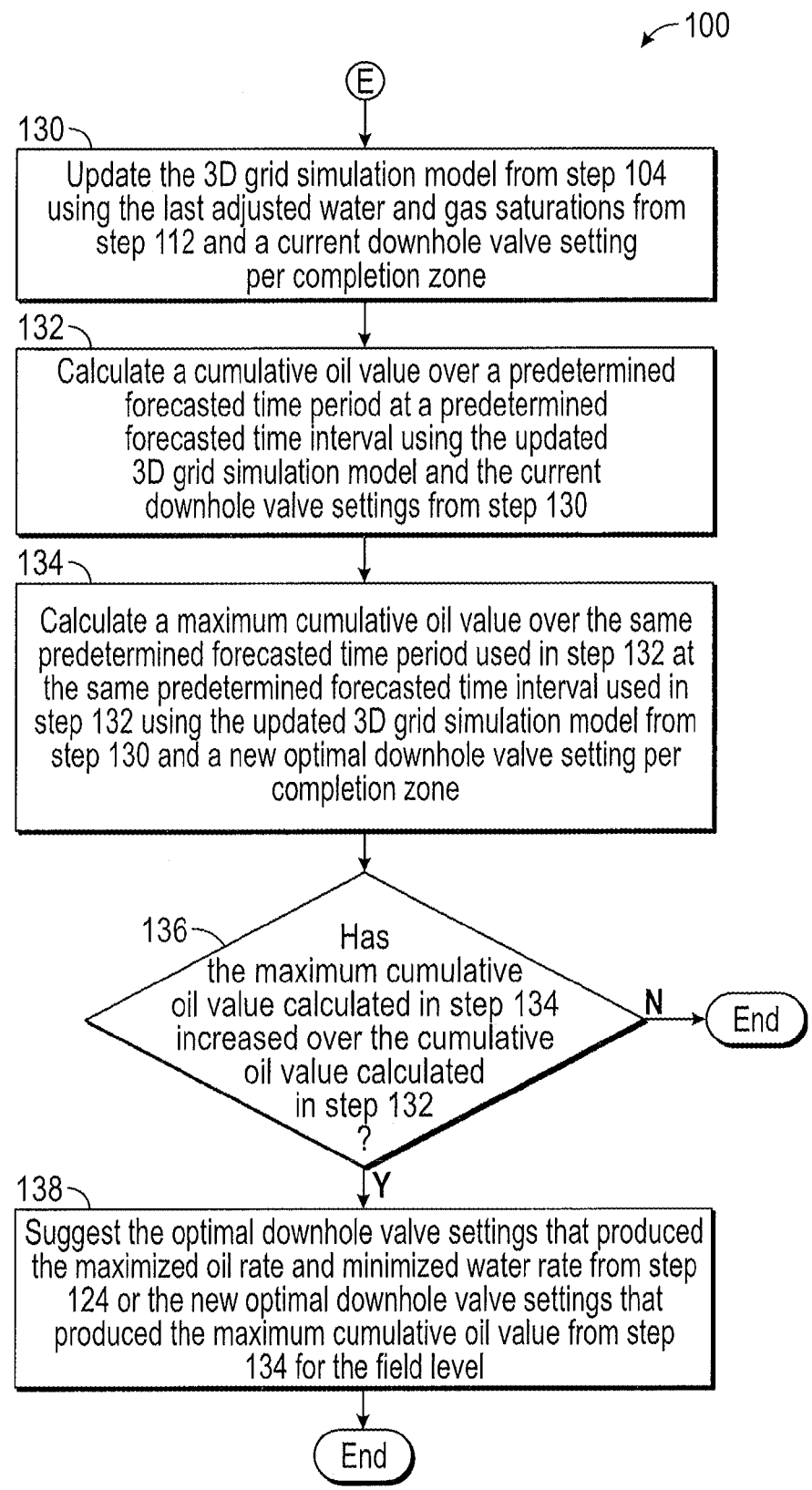

Referring now to FIGS. 1A-1C, a flow diagram of one embodiment of a method 100 for implementing the present disclosure is illustrated. In general, reactive optimization (steps 102-128) captures data from a predetermined interval of time and transforms it into mean data, updates the wellbore simulation model in a steady state (SS) application or wellbore simulator, runs the SS application by adjusting reservoir parameters, provides allocation of flowing parameters in the well for the predetermined interval of time, and compares results with current real-time data. The matched parameters are used in steps 124-128 to optimize the ICV settings for the producing well. The ICV settings may be randomly adjusted by the SS application using an objective function to maximize oil recovery while reducing water production. Steps 124-128 may be repeated several times in order to optimize the ICV settings by changing decision variables and finding a combination of input decision variables that minimize the penalty function (i.e. the constraints are satisfied). When the objective is met, the new ICV settings are used for proactive optimization (steps 130-138). Proactive optimization captures and consolidates the production and injection rates over a predetermined forecasted time period at a predetermined forecasted time interval, compares the forecasted results with the results from reactive optimization and suggests ICV settings if indicators are above or below target values.

Figure 16:
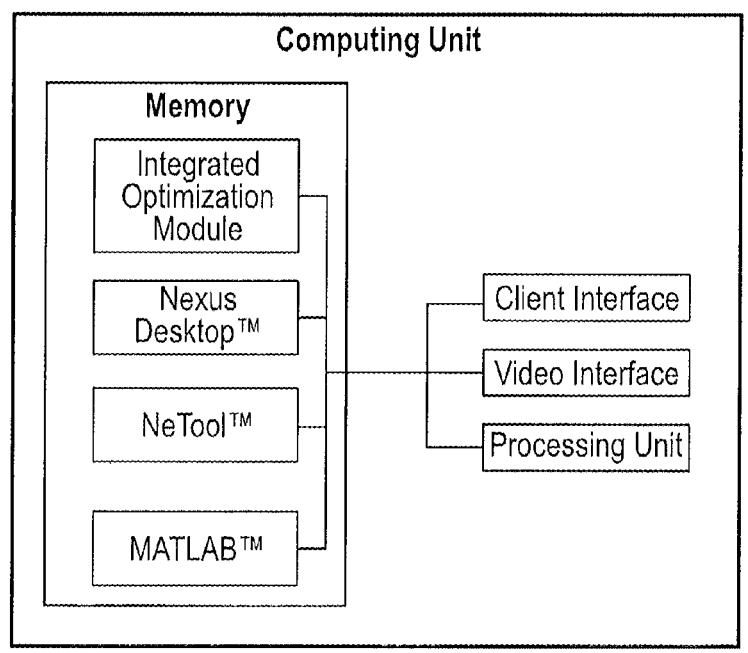
FIG. 16 is a block diagram illustrating one embodiment of a computer system for implementing the present disclosure.

In step 102, static data is input automatically or may be input using the client interface and/or the video interface described further in reference to FIG. 16. The static data may include, for example, well trajectory, well log profiles, relative permeability (RP) curves, pressure, volume, temperature (PVT), completion, well connection in horizontal section (xl), permeability, initial saturation along xl, valve coefficient, valve position and skin factor. This data is static, meaning it is data collected for a predetermined period in time that does not change when used by the method 100.

In step 104, dynamic data from a three-dimensional (3D) grid simulation model is input automatically or may be input using the client interface and/or the video interface described further in reference to FIG. 16. The dynamic data may include, for example, average oil, water and gas saturations and BHP for each well connection, and average static pressure for the well. This data is dynamic, meaning it is real-time data collected for a predetermined interval of time (e.g. 1 day) that may change when used by the method 100. Because this data may change over time, it is averaged over the predetermined interval of time.

In step 106, surface values for the well such as, for example, well productivity index, water and oil rates, flowing bottom hole pressure (BHP), water cut and gas-to-oil ratio (GOR) are calculated using techniques well known in the art and one of the static data and dynamic data from steps 102, 104, respectively, and the static data and dynamic data from steps 102, 104 (as adjusted in step 112), respectively.

In step 108, history matching is performed using techniques well known in the art to compare the surface values calculated in step 106 with real-time surface values from remote sensors for the same surface values calculated in step 106 and to produce a misfit representing a surface model.

In step 110, the method 100 determines if the misfit from step 108 is less than or equal to ten percent (10%)-meaning<=10% difference between the surface values calculated in step 106 and the real-time surface values. If the misfit is <=10%, then the method 100 proceeds to step 114. Otherwise, the method 100 proceeds to step 112.

In step 112, the water and gas saturations from step 104 are adjusted automatically by a predetermined incremental value or they may be adjusted using the client interface and/or the video interface described further in reference to FIG. 16. The method 100 returns to step 106 and repeats steps 106-112 until it produces a <=10% misfit in step 108.

In step 114, the method 100 automatically determines if there is available production logging test (PLT) data for the well or it may be determined using the client interface and/or the video interface described further in reference to FIG. 16. If there is no available PLT data, then the method 100 proceeds to step 124. Otherwise, the method 100 proceeds to step 116.

In step 116, downhole values for the well such as, for example, GOR, water cut, and influx water and oil rates per well connection are calculated using techniques well known in the art and one of the static data and dynamic data from steps 102, 104, respectively, and the static data and dynamic data from steps 102, 104 (as adjusted in step 112), respectively In step 118, history matching is performed using techniques well known in the art to compare the downhole values calculated in step 116 with downhole values from PLT data for the same downhole values calculated in step 116 and to produce a misfit representing a downhole model.

In step 120, the method 100 determines if the misfit from step 118 is less than or equal to ten percent (10%)-meaning<=10% difference between the downhole values calculated in step 116 and the downhole values from the PLT data. If the misfit is not <=10%, then the method 100 returns to step 112 to adjust the water and gas saturations from step 104. Otherwise, the method 100 proceeds to step 122.

In step 122, the method 100 automatically determines whether to repeat the reactive optimization diagnostic steps (104-120) for the same or a different predetermined interval of time based on the downhole values calculated in step 116 or it may be determined using the client interface and/or the video interface described further in reference to FIG. 16. If the method 100 repeats the reactive diagnostic steps for the same or a different predetermined interval of time, then the method 100 returns to step 104 to input dynamic data from the 3D grid simulation model for the same or a different predetermined interval of time. If the same predetermined interval of time (e.g. 1 day) is used, then the dynamic data will include the last day of dynamic data from the 3D grid simulation model, which may be days later than the dynamic data initially input in step 104. Otherwise, the method 100 proceeds to step 124.

In step 124, an optimal downhole valve (e.g. ICV) setting is calculated per completion zone using i) simulation techniques well known in the art to maximize the oil rate and minimize the water rate; and ii) at least one of the surface model from step 108 and the downhole model from step 118.

In step 126, the method 100 determines if the maximized oil rate and minimized water rate (based on the optimal downhole valve settings) from step 124 are acceptable by comparing the same to the real-time surface values for oil rate and water rate from step 108. If the maximized oil rate from step 124 increased compared to the real-time oil rate from step 108 and the minimized water rate from step 124 decreased compared to the real-time water rate from step 108, then the maximized oil rate and the minimized water rate from step 124 are acceptable. If the maximized oil rate from step 124 increased compared to the real-time oil rate from step 108 and the minimized water rate from step 124 increased compared to the real-time water rate from step 108, then the maximized oil rate and the minimized water rate from step 124 may be acceptable. If the maximized oil rate from step 124 decreased compared to the real-time oil rate from step 108 and the minimized water rate from step 124 increased or decreased compared to the real-time water rate from step 108, then the maximized oil rate and the minimized water rate from step 124 are unacceptable. If the maximized oil rate and the minimized water rate from step 124 are not acceptable, then the method 100 proceeds to step 130. Otherwise, the method 100 proceeds to step 128.

In step 128, the optimal downhole valve settings that produced the acceptable maximized oil rate and minimized water rate from step 124 are suggested for the field level and the method 100 ends.

In step 130, the 3D grid simulation model from step 104 is updated using the last adjusted water and gas saturations from step 112, a current downhole valve setting per completion zone from downhole remote sensors and techniques well known in the art.

In step 132, a cumulative oil value is calculated over a predetermined forecasted time period (e.g. 5 years) at a predetermined forecasted time interval (e.g. annually) using the updated 3D grid simulation model and the current downhole valve settings from step 130, and techniques well known in the art.

In step 134, a maximum cumulative oil value is calculated over the same predetermined forecasted time period used in step 132 at the same predetermined forecasted time interval used in step 132 using the updated 3D grid simulation model from step 130 and a new optimal downhole valve setting per completion zone that is based on simulation techniques well known in the art to maximize the cumulative oil value.

In step 136, the method 100 determines if the maximum cumulative oil value calculated in step 134 has increased over the cumulative oil value calculated in step 132. If the maximum cumulative oil value calculated in step 134 has not increased over the cumulative oil value calculated in step 132, then the method 100 ends. Otherwise, the method 100 proceeds to step 138.

In step 138, the optimal downhole valve settings that produced the maximized oil rate and minimized water rate from step 124 or the new optimal downhole valve settings that produced the maximum cumulative oil value from step 134 are suggested for the field level and the method 100 ends.

Example

The reservoir modeled in this example is multi-layered, highly faulted, and predominantly a depletion-drive reservoir with negligible energy support from the aquifer. It is characterized as a massive carbonate ramp, with high permeability and good porosity. The overall gross thickness of the reservoir ranges from 350 to 400 ft and has very high-net-to-gross ratios of 0.8 to 0.9 over most of the reservoir. The average oil gravity is about 27° API, but degrades with depth. The oil viscosities in the reservoir range from about 1.3 cP in the upper crestal portion to nearly 30 cP in the flanks. Water is injected into the reservoir on a nine-spot water injection pattern. The reservoir permeability ranges between 0 and 200 mD; however, areas identified as thief zones have permeabilities of around 1 Darcy.

Figure 2:
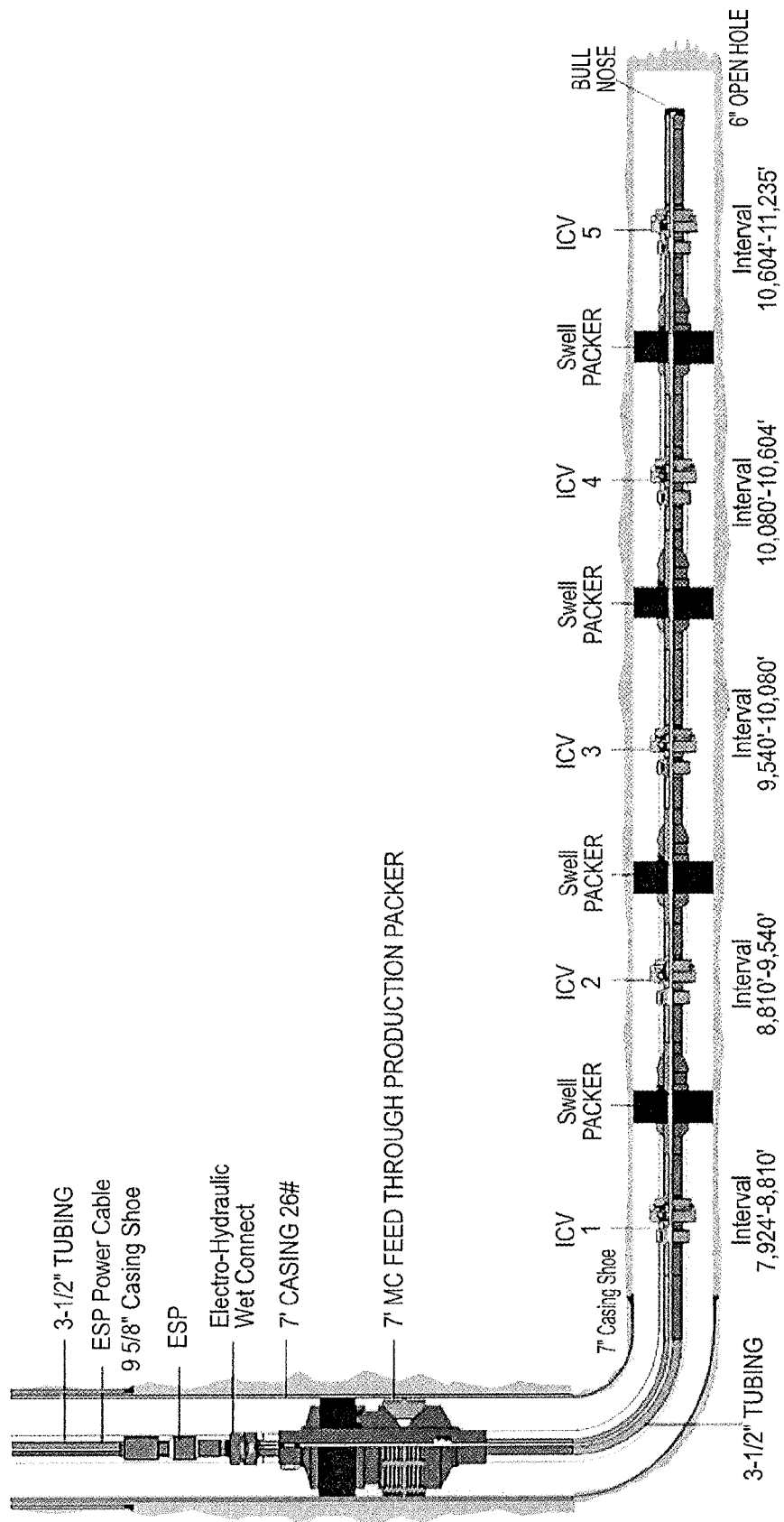

The completion is a 6-inch open hole and extends horizontally for 3,200 ft starting at a 7-inch casing shoe at 7,900 ft., which is illustrated by the well completion diagram in FIG. 2. According to the permeability profile for this well (well #1), five intervals separated with expandable (swell) packers have been planned to isolate non-reservoir/productive areas and the high-permeability zones. The ICVs are placed in front of the high-permeability zones. Each ICV is equipped with quartz pressure and temperature sensors and electrical cable along the horizontal section.

The completion includes one mechanical feedthrough packer, five expandable packers with feedthrough, five ICVs, and five dual gauges. Because well #1 is completed with 7-inch casing all the way to the surface, an electro-hydraulic wet connector is required to run an electric submersible pump (ESP) on top of the mechanical packer. The electro-hydraulic wet connector allows the ESP to be pulled without pulling the smart completion.

To enable production estimation from the reservoir through each ICV, dual permanent gauges were installed in the zones with each variable ICV. These gauges can also provide annulus pressure when zones are shut in and are essential for reservoir management. The annulus pressure gauge can provide valuable information, such as reservoir static pressure and pressure buildup analysis without well intervention.

Several designs of ICVs were modeled to evaluate the performance of reservoir productivity. A 3.5-inch valve was selected for this example, allowing a pressure drop in the range of 200 to 500 psi, with 10 settings controlling over 200 gal/min. This valve is well suited for deep water, high pressure/high temperature (HP/HT) reservoirs where operating conditions are severe.

Figure 3:
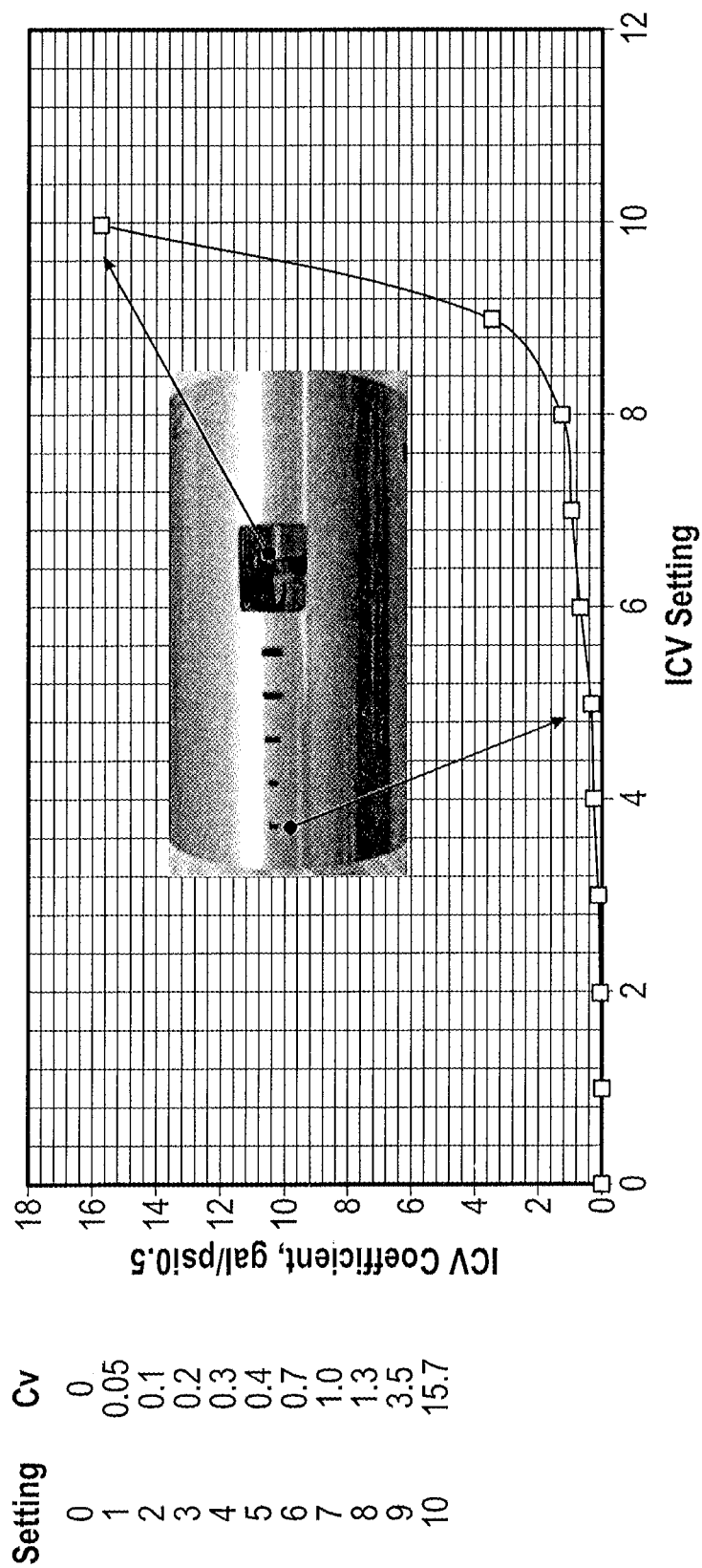
FIG. 3. is a graph illustrating ICV settings as a function of the ICV flow coefficient (Cv) for a 3.5-inch ICV.

Each ICV is a hydraulically-actuated valve, operated remotely by using a digital hydraulic down-hole control system. Each ICV has premium thermoplastic hydraulic chamber seals that are designed to operate under high-actuation pressures and over a range of temperatures (40° F. to 330° F.) and let the valve differentially unload at a maximum pressure of 5,000 psi without the risk of valve damage. The valve flow coefficient (Cv) has been broadly tested using compressible fluids at high pressure and high temperature. The Cv was measured at different flow settings as illustrated by the graph in FIG. 3.

The instrumentation measures real-time pressure and temperature at wellhead conditions. A multiphase flow meter is equipped at the wellhead to measure surface oil, water, and gas flow rates instantaneously, enabling calculation of water cut and gas-oil ratios. Downhole, the well is configured with an ESP that is equipped with downhole pressure and temperature gauges at the heel well position. Additionally, in the lateral section, each ICV joint has gauges that measure flowing BHP at different lateral positions. No flowmeter is installed downhole.

A completion simulator was used to calculate the hydrodynamic behavior of the full lateral section. The completion design (e.g. packer locations, gravel pack, ICV, and other completion components) are designed in the completion simulator. The completion simulator analyzes the effect of different completion schemes, providing more accurate results for oil rate and flowing BHP. The completion simulator can simulate the velocity, rate, and pressure drop from the reservoir face, across completions, through to the wellhead. From the numerical simulation, input and output files are downloaded into the wellbore simulator. Static and dynamic properties, such as cell porosity, permeability, thickness, cell reservoir pressure, water saturation, and others, are visualized in the wellbore simulator.

Figure 4A:
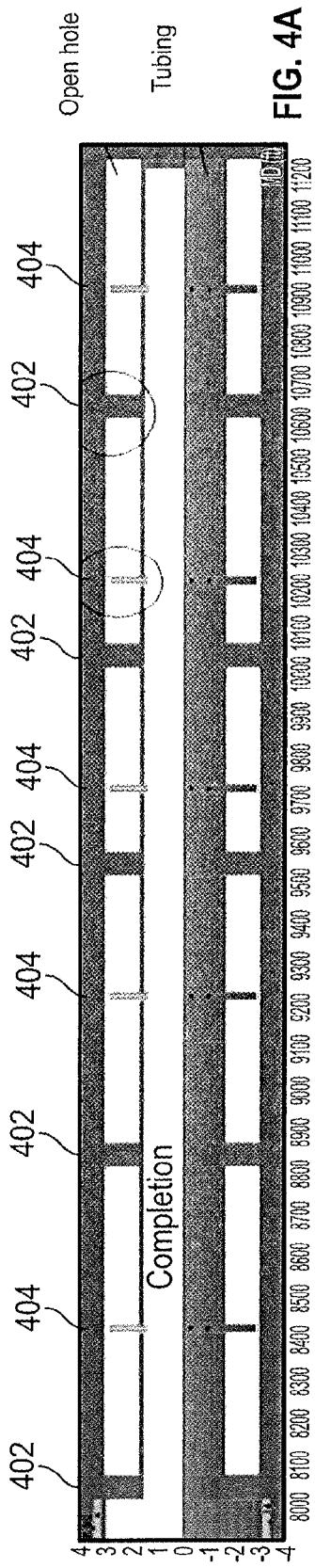
FIG. 4A is a well completion diagram illustrating the position of each packer and each ICV along the horizontal section in FIG. 2.
Figure 4B:
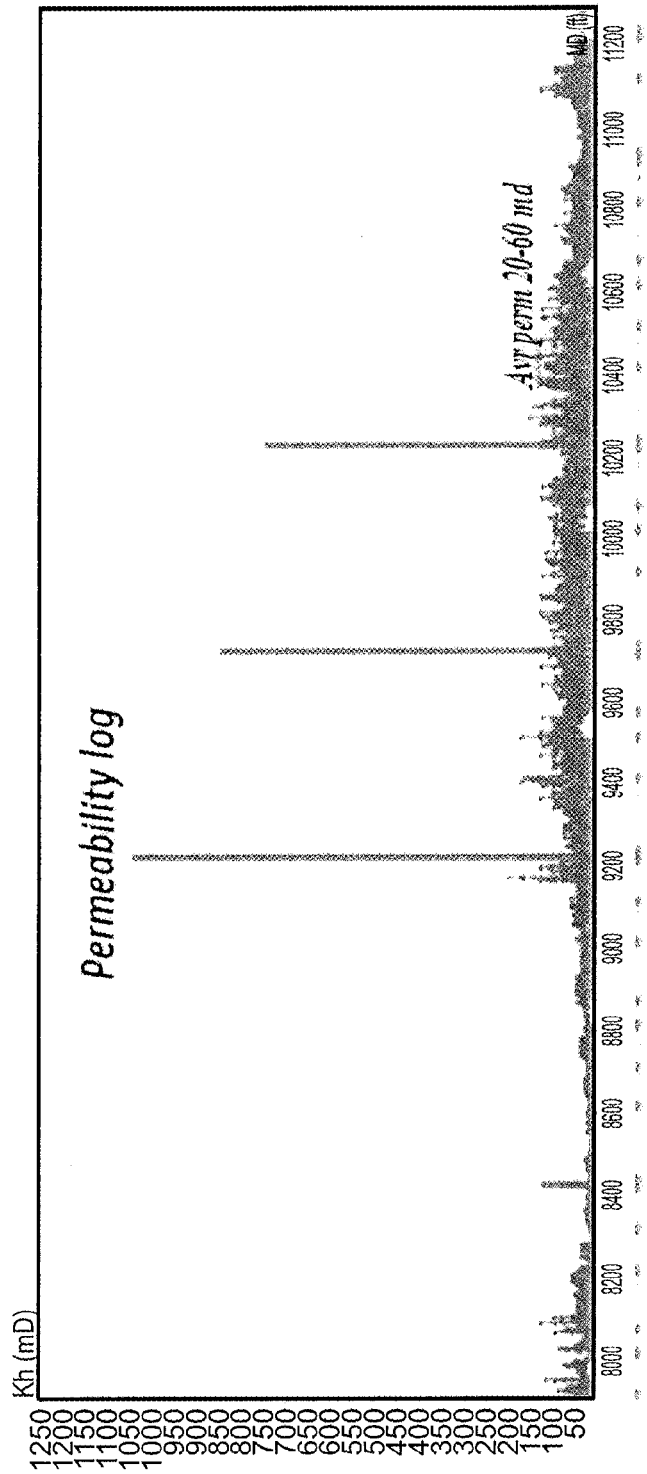
FIG. 4B is a permeability log illustrating permeability along the horizontal section relative to the position of each packer and ICY.
Figure 4C:
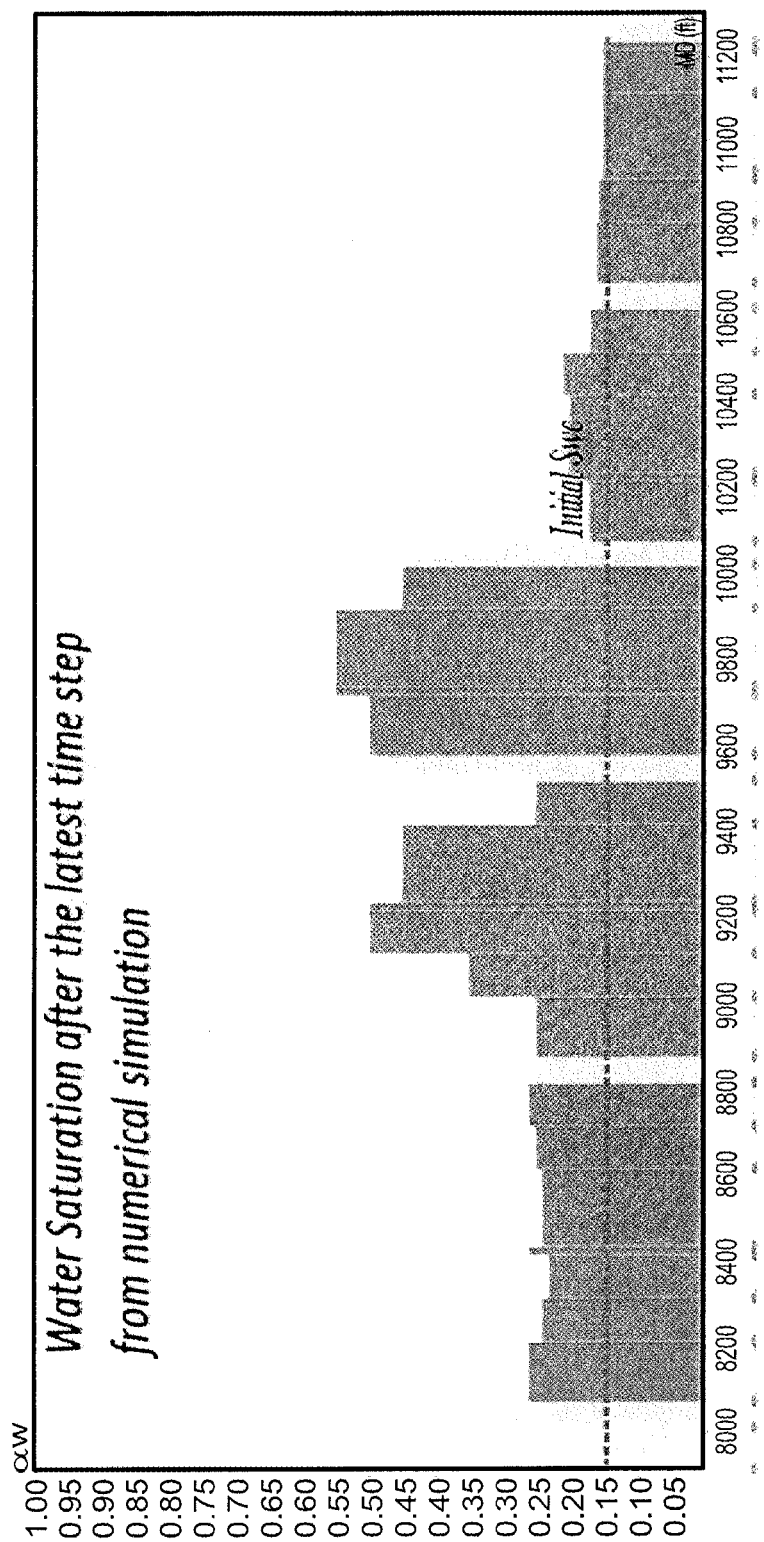
FIG. 4C is a water saturation profile illustrating water saturation along the horizontal section relative to the position of each packer and ICY.

Dynamic properties, such as pressure, volume, and temperature (PVT), relative permeability curves (RP) and well completion are modified to achieve the best permeability and porosity pathway in layers of the reservoir. Porosity and permeability models are derived from well logs. However, because of recent PLT-BU characterization, the main heterogeneities such as high-permeability channels and permeability streaks were set up manually. In FIG. 4A, the wellbore completion diagram illustrates the position of each packer and each ICV along the horizontal section in FIG. 2. In FIG. 4B, a permeability log illustrates permeability along the horizontal section relative to the position of each packer and ICV. In FIG. 4C a water saturation profile illustrates water saturation for the latest time step run in the simulation along the horizontal section relative to the position of each packer and ICV.

Reactive optimization utilizes three primary stages: i) filtering real-time production data; ii) tuning the well model and well allocation by region; and iii) optimization of ICV settings.

Figure 5:
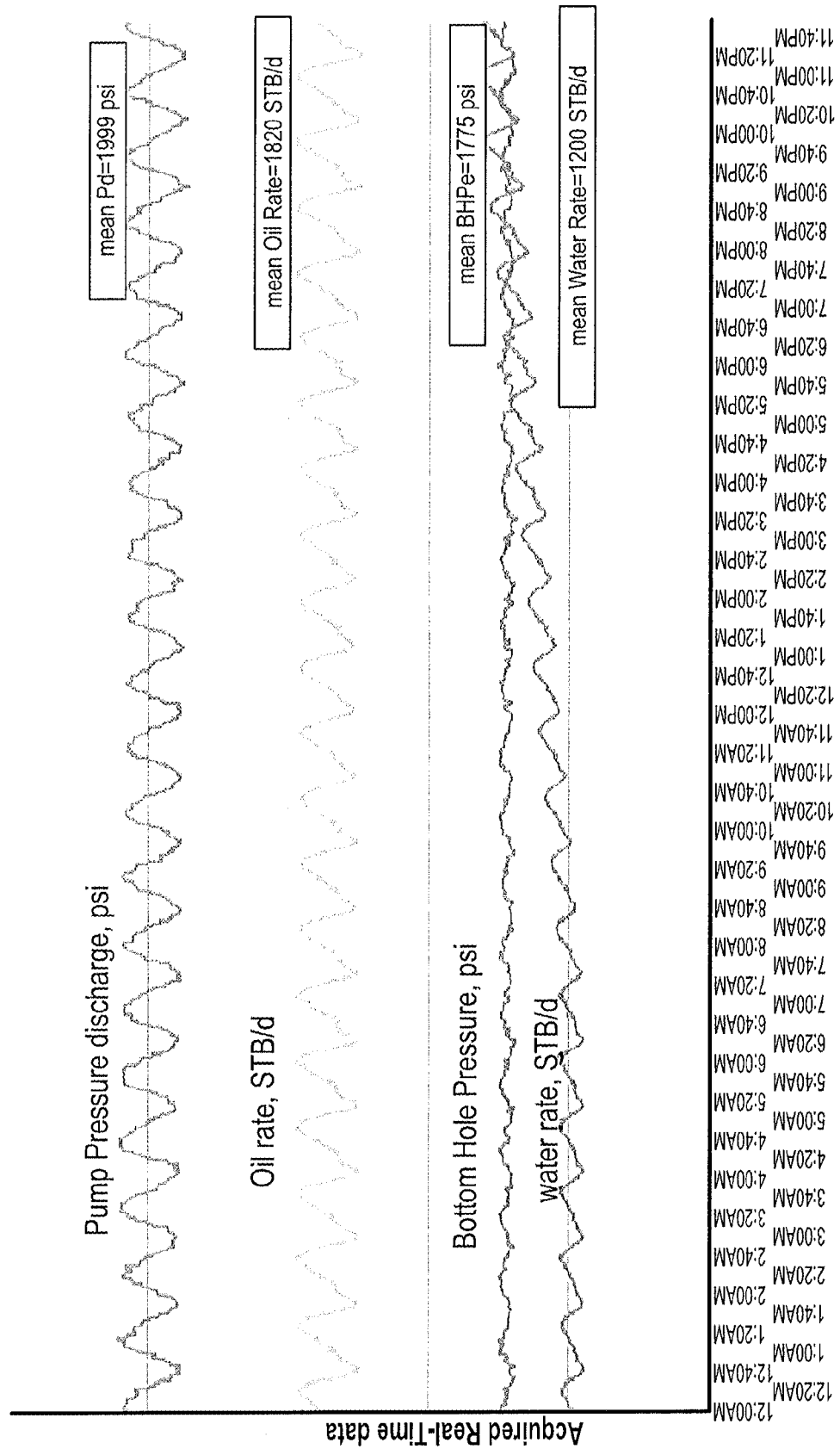
FIG. 5 is a graph illustrating acquired real-time data collected over 24 hours for pump pressure discharge, total oil rate, water rate and bottom-hole pressure.

Real-time data is retrieved from a database and used to calculate averages over a predetermined interval of time (e.g. 24 hours). Before calculating the averages, the data may be passed through a cleaning and filtering data process that uses several algorithms to prepare the data and improve the quality. The 24 hours of data is sampled each minute (1,440 samples) and transformed into an average daily production format, which is added to a simulator data file structure. Acquired real-time data collected over 24 hours is illustrated by the graph in FIG. 5 for pump pressure discharge, total oil rate, water rate and bottom-hole pressure. A series of rules may also be set up; for example, when water cut increases by 1% over the span of one day and oil production simultaneously decreases, an alarm is generated to alert the user that the model needs to be updated.

Figure 6A:
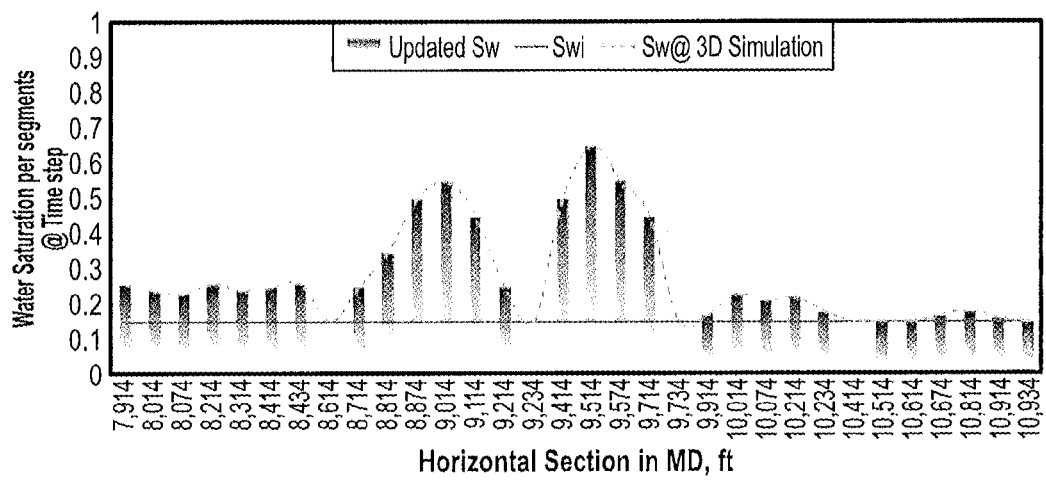
FIG. 6A-6D are graphs illustrating exemplary wellbore pressure profiles (non-matched and non-optimized).
Figure 6B:
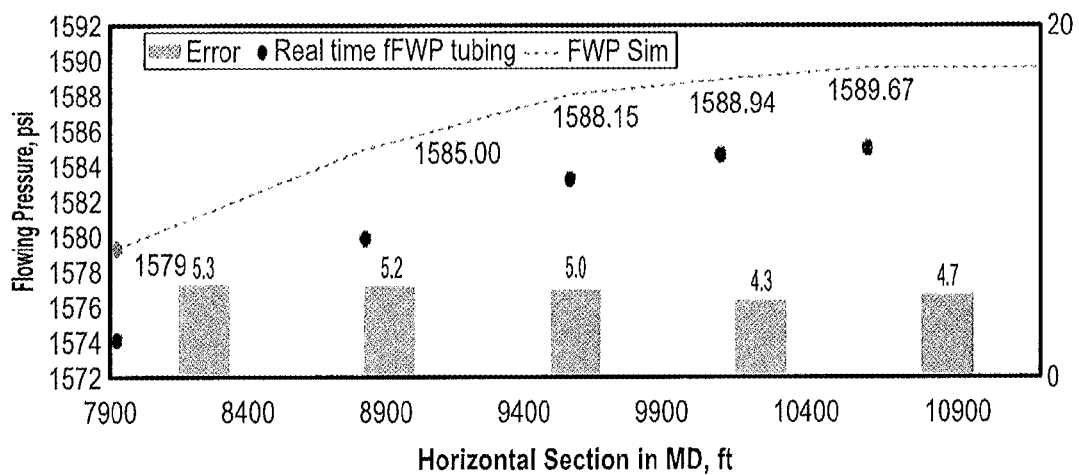
Figure 6C:
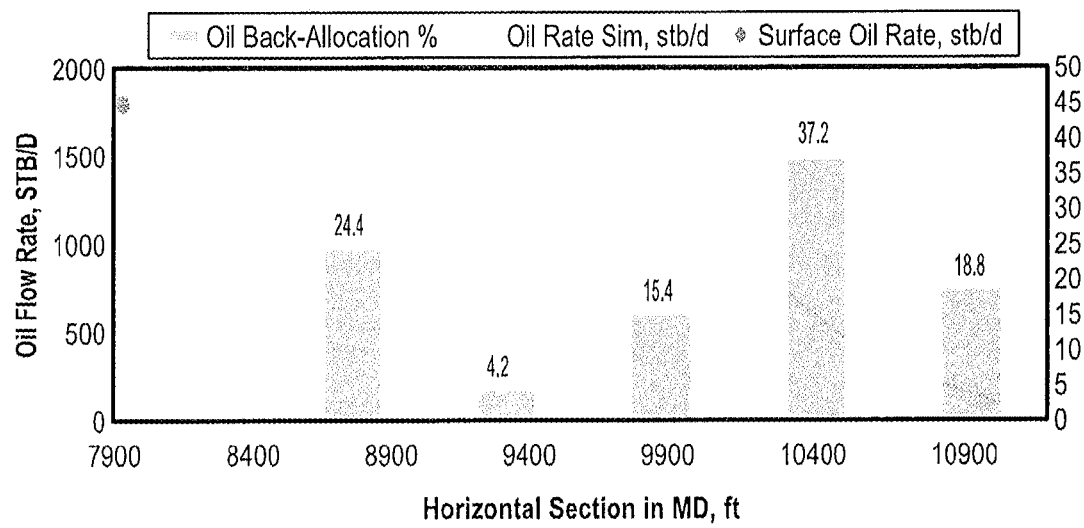
Figure 6D:
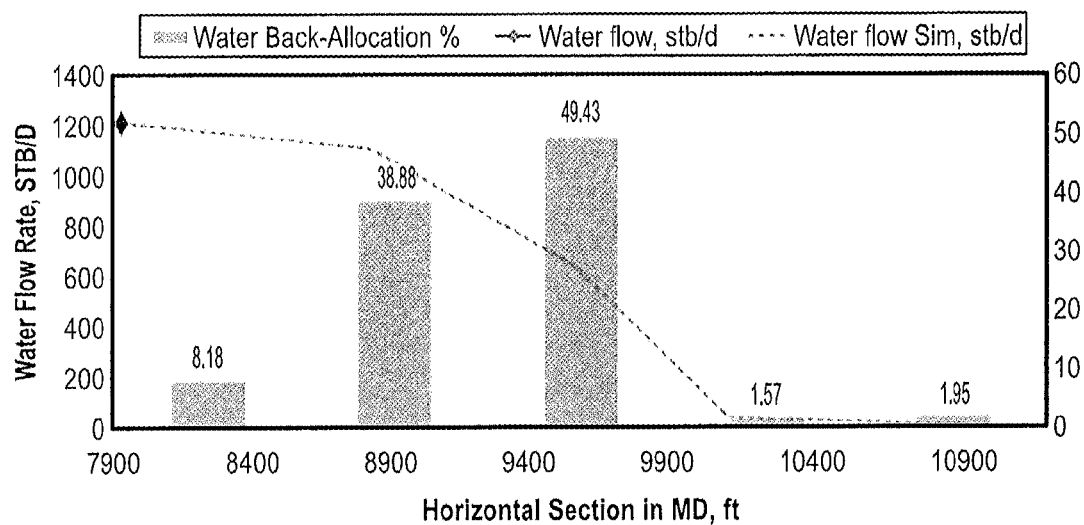

The updated water saturation profiles are retrieved from the numerical simulation at the time step corresponding to the previous month. A total of 34 points or cells are updated in the wellbore simulation. At the wellhead, the wellhead pressure (WHP) is updated while the wellbore simulation calculates flowing BHP and provides the entire wellbore pressure profile under dynamic flow conditions along the horizontal (lateral) section of the well. In FIGS. 6A-6C, four graphs illustrate the wellbore pressure profiles (non-matched and non-optimized) for this example. In FIG. 6A, the graph illustrates a water saturation profile along the horizontal section. The initial water saturation (Swi=15%) is represented by a solid line, the water saturation profile from the 3D simulation according to the latest matched simulation iteration is represented by a dotted line; and the updated water saturation profile is represented by the bars. It is assumed that the updated water saturation profile will be higher than the previously simulated water saturations. In FIG. 6B, the graph illustrates a flowing wellbore pressure (FWP) profile along the horizontal section. Both real-time (dots) and simulated (dotted line) FWP are observed with their corresponding errors (bars). For this initial simulation, measured and simulated FWP do not match; the maximum accepted error is 5%. In FIG. 6C, the graph illustrates an oil flow rate (oil rate) profile along the horizontal section. The oil rate is observed at the surface (single point). The back-allocation oil rate (bars) is calculated and a dotted line represents the simulated oil rate. At the heel of the well, the total calculated oil rate should match the measured surface oil rate. In FIG. 6D, the graph illustrates a water flow rate (water rate) profile along the horizontal section. The water rate is observed at the surface (single point). The back-allocation water rate (bars) is calculated and a dotted line represents the simulated water rate. At the heel of the well, the total calculated water rate should match the measured surface water rate.

The target is to match the FWP profile and surface total rates. The objective function of this local history matching is to minimize the misfit between the measured and calculated FWP profile (5 points, in FIG. 6B), as well as the minimized error between the measured and calculated surface oil and water rates (1 point for surface oil rate and another for water). Water saturation and skin profiles are changed individually in the 34 cells associated with the wellbore; skin ranges between 0 and 2. The water saturation profile starts with the history-matched 3D grid simulation model for the previous month (the minimum value of the range), and water saturation is gradually adjusted until a reasonable match in water rates per region is achieved. Permeability is not part of the parameterization matrix because it is assumed that permeability values along the horizontal section already match the full-field numerical simulation and permeability does not suffer from any impairment. The water saturation profile is imported from the 3D grid simulation model.

Figure 7:
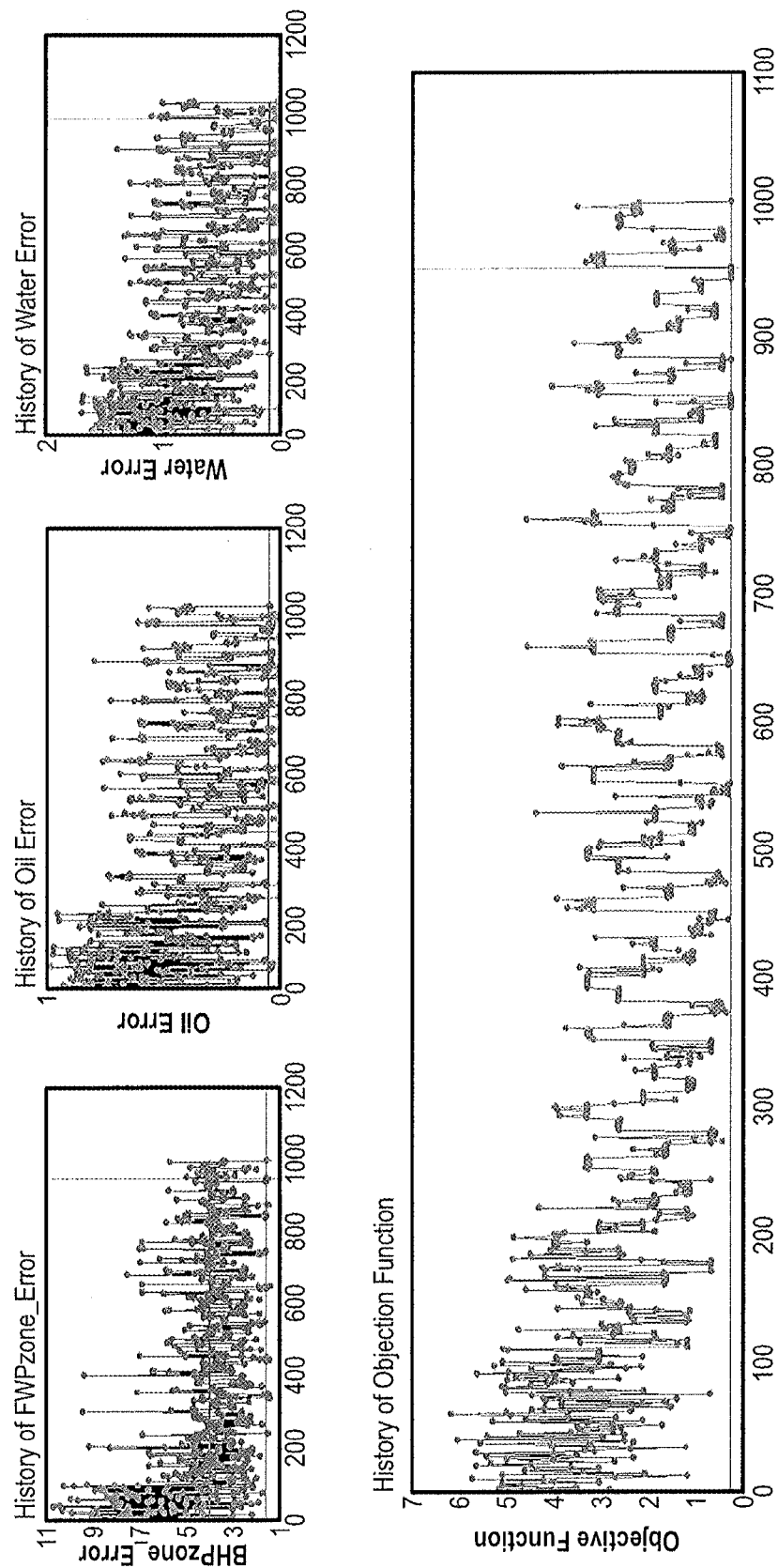
FIG. 7 is a display illustrating an FWP zone error graph, an oil error graph and a water error graph for comparison with an objective function graph.

The technique used to perform the history matching was the Multi-Island Genetic Algorithm (MIGA), an exploratory technique well suited for discontinuous design spaces. In MIGA, like other genetic algorithms, each design point is perceived as an individual sample with a certain value of fitness based on the value of the objective function and constraint penalty. In FIG. 7, a display illustrates an FWP zone error graph, an oil error graph and a water error graph for comparison with an objective function graph. Each error and the objective function are plotted against the simulation runs. The objective function is reached at simulation run number 949, which is where the FWP zone error, oil error and water error are minimized.

Figure 8A:
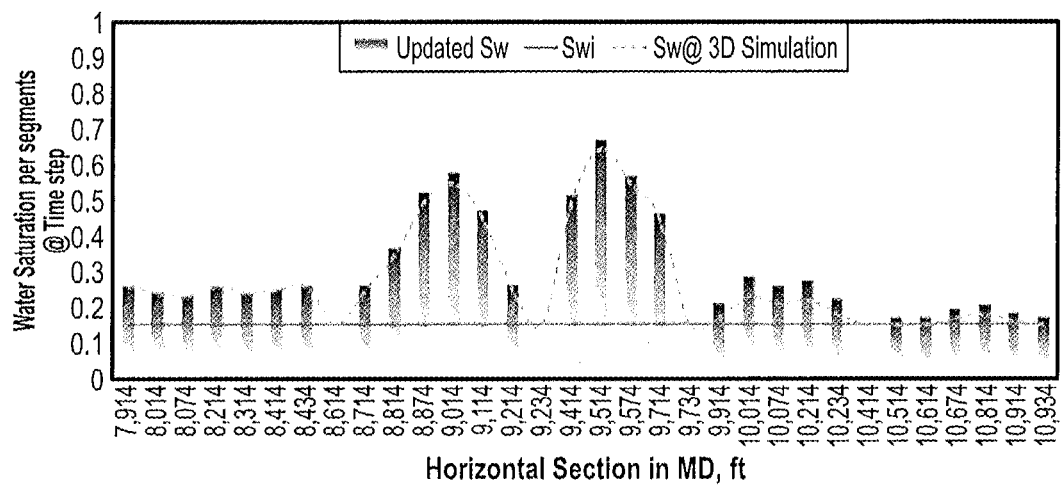
FIG. 8A-8D are graphs illustrating the exemplary wellbore pressure profiles in FIGS. 6A-6D (matched and non-optimized).
Figure 8B:
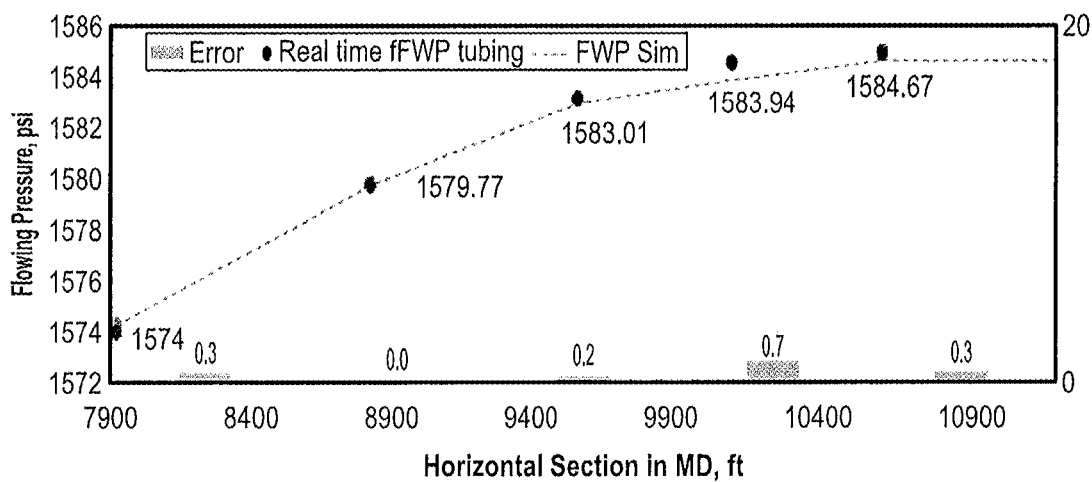
Figure 8C:
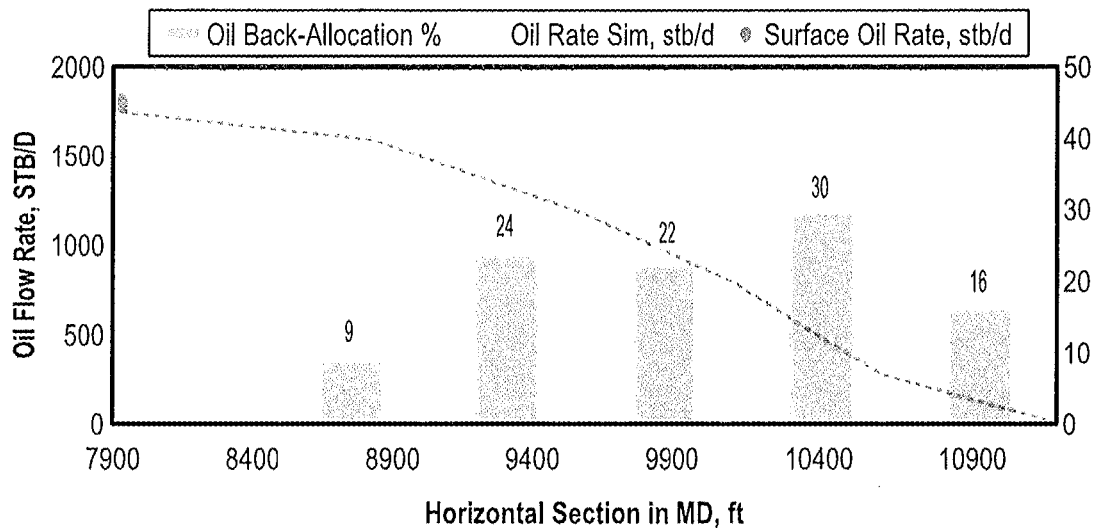
Figure 8D:
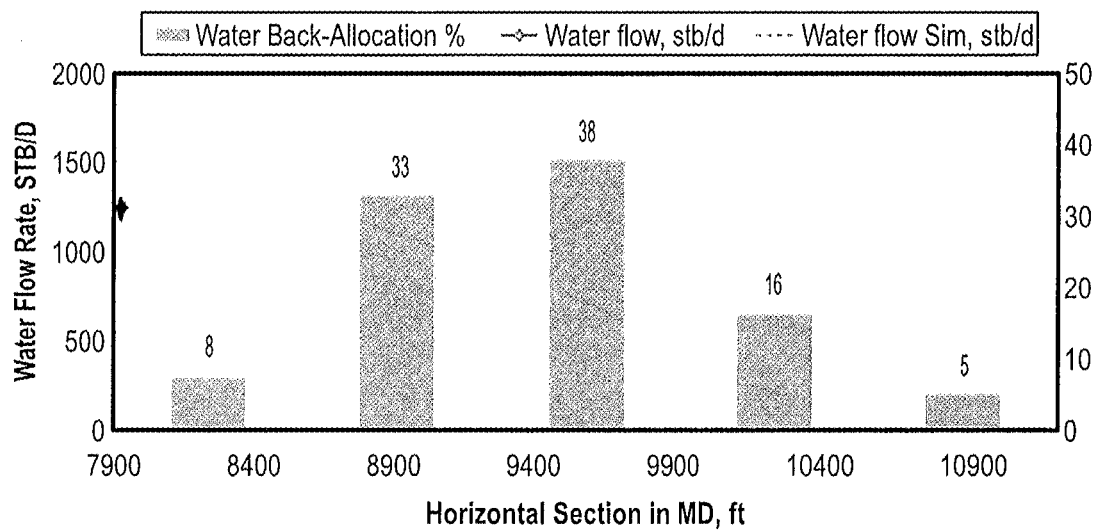
Figure 9:
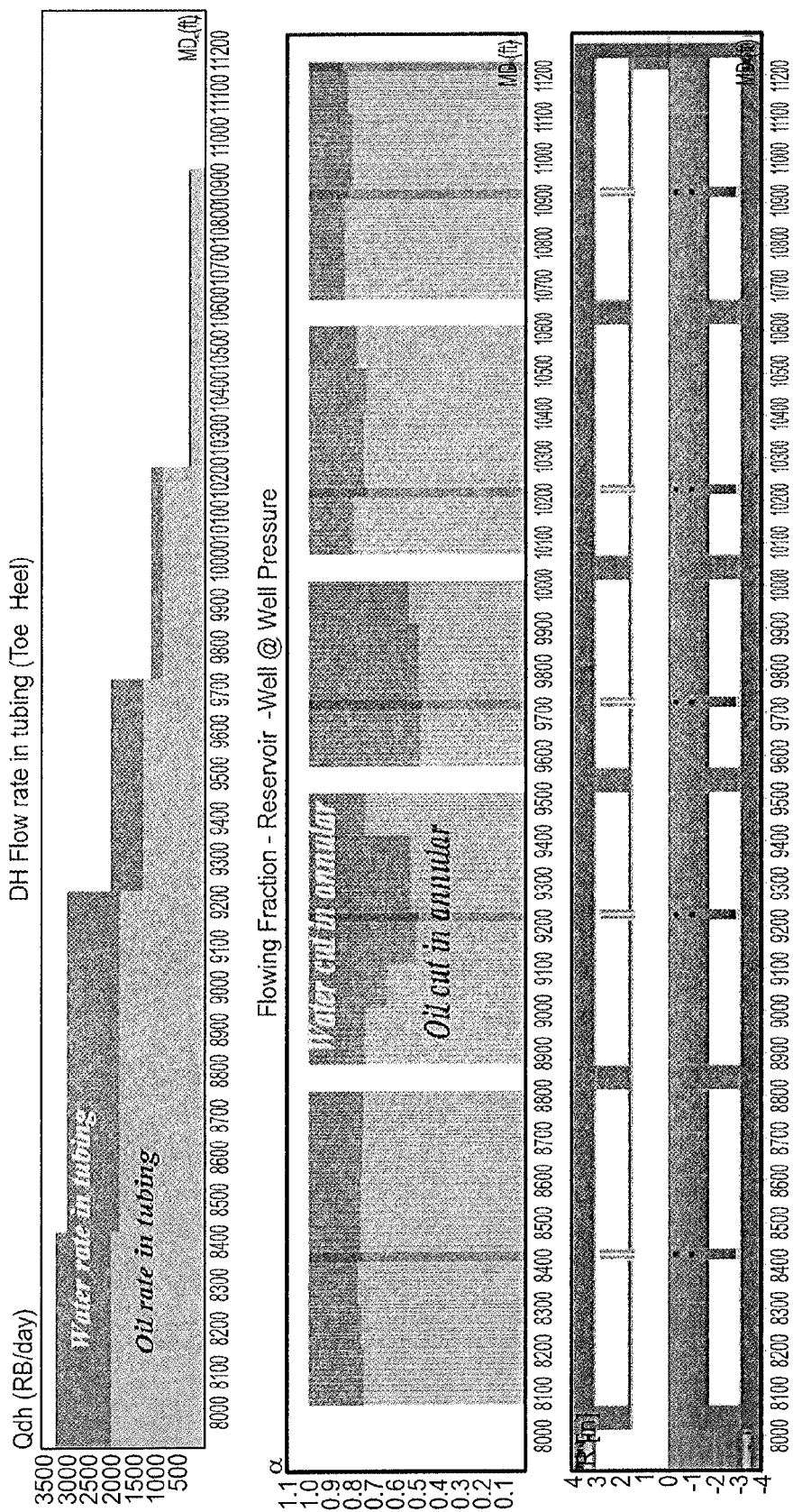
FIG. 9 is a display of virtual Production Logging Test (PLT) data illustrating the oil/water rates in tubing and the oil/water cuts in the wellbore annulus compared to the wellbore completion diagram in FIG. 4A.

In FIGS. 8A-8D, four graphs illustrate the wellbore pressure profiles in FIGS. 6A-6D for this example with matching parameters (matched and non-optimized). A global optimized point is obtained when the objective function is 0.45. In this iteration, the water saturation profile (FIG. 8A) in region 1 stays constant compared to the previous month while regions 2 and 3 have increased water saturation, progressively, and regions 4 and 5 are increasing notably. Still, regions 2 and 3 are the most problematic in terms of water saturation. The FWP profile (FIG. 8B) shows a good match between real-time and calculated data with an SQR-Sum of errors of 1.22. The oil rate at the surface (FIG. 8C) matches at 1,760 STB/D (observed data 1,820 STB/D, e=3.2%), and the water rate at the surface (FIG. 8D) is 1,250 STB/D (observed data is 1,200 STB/D, e=4.1%). More importantly, FIGS. 8C-8D illustrates the back allocation in both the oil rate and water rate profiles. The main contributors in oil flux are regions 4, 2 and 3 with 30%, 24% and 22%, respectively. However more than 70% of total water is coming from regions 3 and 2 as well with a contribution of 38% and 33%, respectively. In FIG. 9, virtual Production Logging Test (PLT) data is illustrated in the display for the oil/water rates in tubing and the oil/water cuts in the wellbore annulus compared to the wellbore completion diagram in FIG. 4A. Even in the absence of actual PLT data, an estimation of back-allocation for both water and oil across the horizontal section can be determined.

The final parameters (skin and water saturation in 34 cells) that match the well surface production and flowing BHP-FWP may be saved in a new well model. The model is submitted to an optimization process using Adaptive Simulated Annealing (ASA), a rapid-exploratory technique well-suited for discontinuous design spaces that obtains a solution with minimal CPU time for a problem that potentially has a great number of solutions. The ASA algorithm is very well suited for solving highly non-linear problems using rapid run-time analysis code, when finding a global optimization is more important than a quick improvement of the design.

Figure 10:
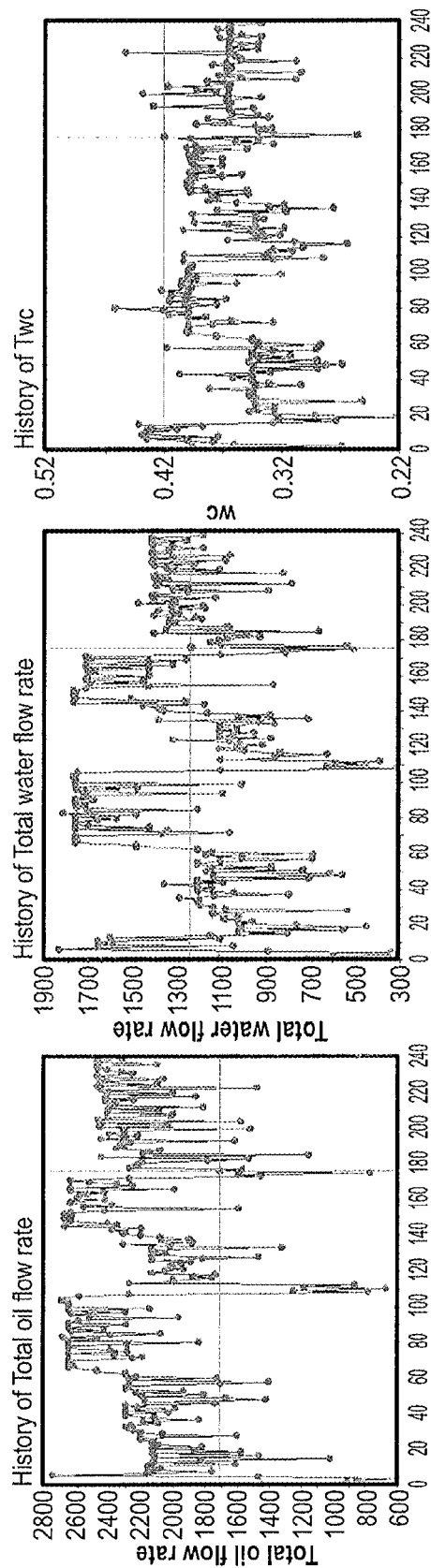
FIG. 10 is a display illustrating separate graphs for oil rate, water rate and water cut.
Figure 11:
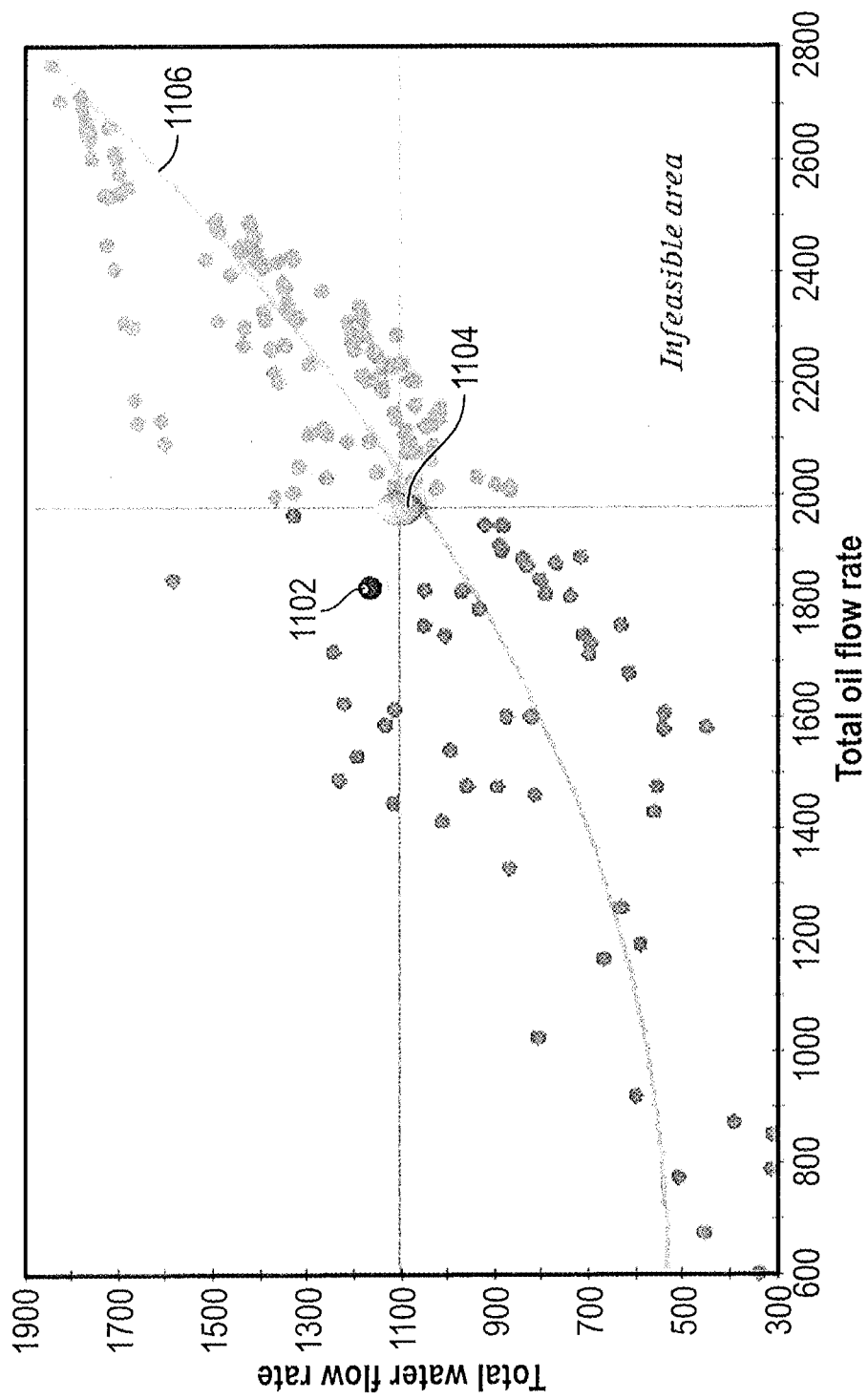
FIG. 11 is a graph illustrating total water flow rate as a function of total oil flow rate.

The objective function here is to minimize the surface well water cut and maximize the surface well oil rate production by adjusting the ICV settings in the five regions. 250 simulations, are generated to select the best combination setting. The optimization is penalized when the newly calculated solution produces an oil rate below the base case or a water-cut over the base case. The current BHP and ESP pump frequency are updated and scenarios are simulated with 100 psi above or below the actual BHP value. The base case presented the following conditions: oil rate 1,820 STB/D, water rate 1,200 STB/D, water cut 40%, and fBHP 1,574 psi. In FIG. 10, a display illustrates separate graphs for oil rate, water rate and water cut. Each graph is plotted against the number of simulation runs and the circle in each graph represents the base case. The objective function is reached at simulation run number 175 where the ICV setting is adjusted from 10 (initial setting) to 9 in region 2, 6 in region 3, and 9 in region 4. The ICV setting in regions 1 and 5 remains at 10. This combination increases the oil rate from 1,820 to 1,950 STB/D, which increases oil production by 7% and decreases water production at 1,100 STB/D. The water cut is reduced from 40 to 36%. In FIG. 11, a graph illustrates total water flow rate as a function of total oil flow rate. The general trend indicates that to maximize the total oil flow rate, the total water flow rate increases in different proportions, but shows similar tendencies. However, there are scenarios in which combining the best settings among each ICV can result in a significant improvement in total oil flow rate while maintaining the same total water flow rate and decreasing the water cut. The shaded area is declared as no longer feasible as the objective function cannot reduce the water cut below 40%. In other words, this is the area in which the oil flow rate can be maximized but the water cut increases over the base case (40%). The base case (1102) and the optimal case (1104) are shown. The curve 1106 represents an optimization curve.

Figure 12A:
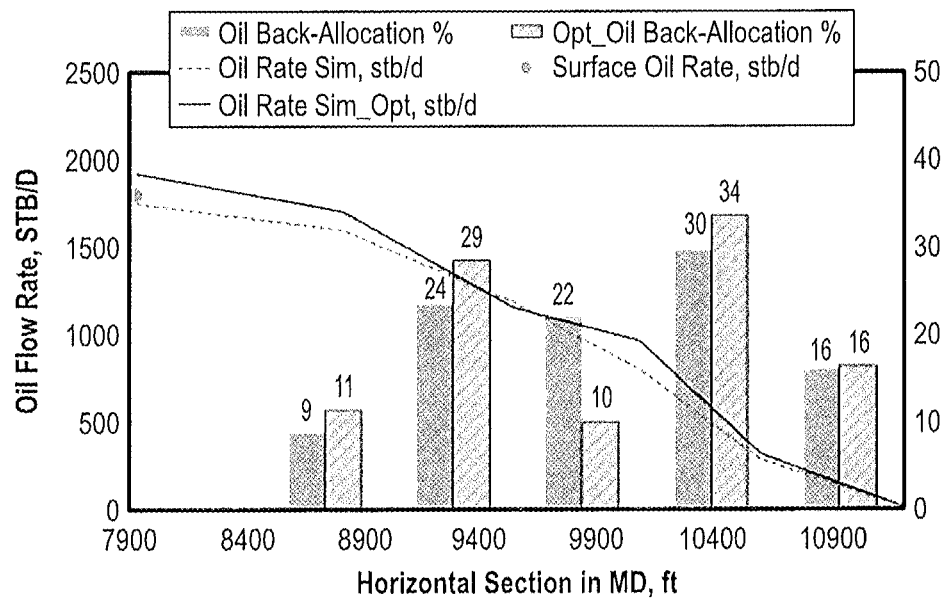
FIG. 12A-12B are graphs illustrating the exemplary wellbore pressure profiles in FIGS. 8C-8D (matched and optimized).
Figure 12B:
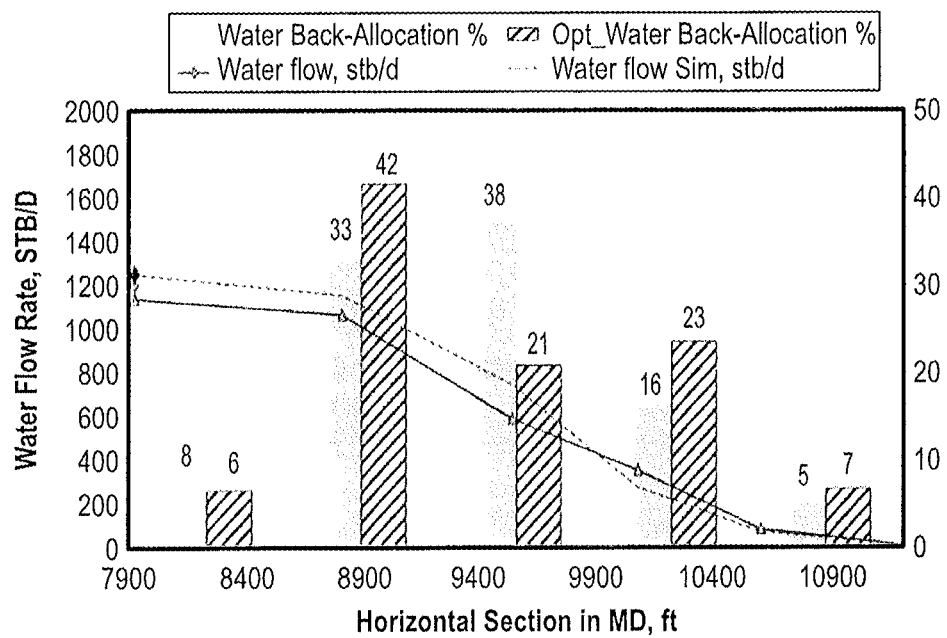

The new ICV settings have now been identified. The new setting was reproduced manually in the completion simulator thus, producing the conditions shown in FIG. 12A-12B. Regions 1, 2, and 4 show improved oil production while water also increases significantly in regions 2 and 4. In region 3, where the ICV setting was adjusted to 6, oil production decreases along with water production. Water back-allocation is newly calculated.

Proactive optimization utilizes three primary stages: i) filter real-time production data to monthly production data; ii) run 3D grid simulation to provide forecasting for 10 years, changing ICV settings each year in each valve; and iii) generate production profile and ranking.

The 3D grid simulation model was built with 1.4 million cells in a commercial simulator. The 3D grid simulation model covers 5 production wells and 2 injection wells. A black-oil fluid model is used with strong viscosity and oil density variation from the crest to the flanks of the geological structure. Porosity and permeability models are derived from a geo-cellular model. Multiple local grid refinement (LGR) areas were built in the 3D grid simulation model to represent those heterogeneities. In particular, an LGR area was created around production well #1 with a total of 34 cells associated with the mechanical completion based on FIG. 2. Water is channelized through to the well producers via high water saturation zones.

Figure 13:
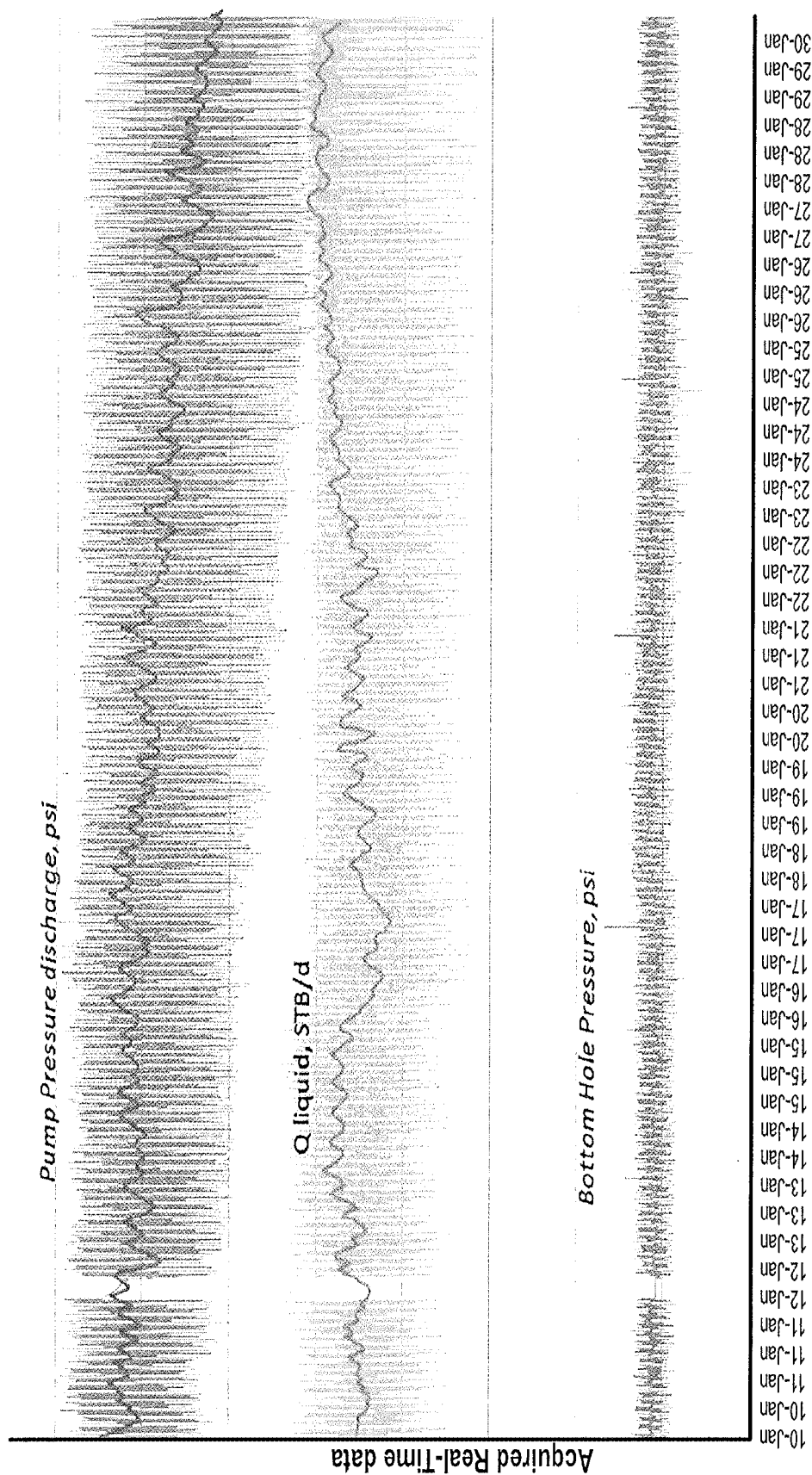
FIG. 13 is a graph illustrating acquired real-time data for pump pressure discharge, total liquid rate, and bottom-hole pressure over 21 days.

Real-time data is retrieved from sensors as well as the data previously aggregated by different filtering and cleansing processes, which is used to calculate the monthly averages. Before calculating the averages, the data may be passed through a cleaning and filtering data process that uses several algorithms to prepare the data and improve the quality. The daily data (43,200 samples) is transformed into an average monthly production format and added to the simulator data file structure. An example is shown in FIG. 13, which is a graph illustrating acquired real-time data for pump pressure discharge, total liquid rate, and bottom-hole pressure over 21 days.

Figure 14:
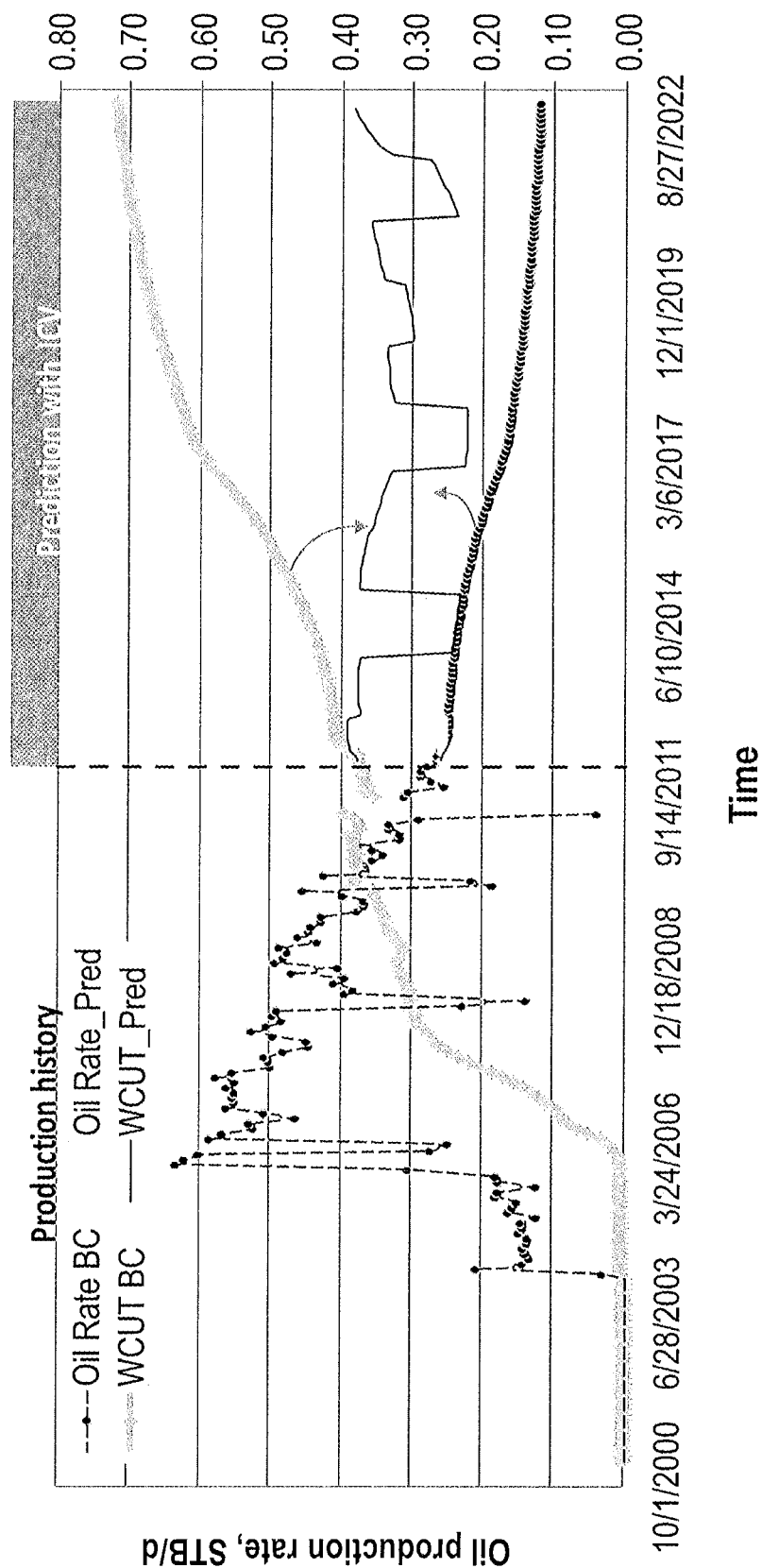
FIG. 14 is a graph illustrating the oil rate base case and water cut base case compared to the predicted oil rate and the predicted water cut over time for the exemplary well.

The 3D grid simulation model was updated with geological-well production profiles determined by the PLT data. Other reservoir properties were considered as fixed. In FIG. 14, a graph illustrates the production history of a well that will be converted into a smart well (well #1). Currently, oil production is 1,820 STB/D with a water cut of 40%. By keeping a voidage replacement ratio (VRR) of 0.75 and the same injection profile associated with well #1, a base case was built to predict 10 years of oil and water production using the current open-hole completion. In FIG. 14, the oil rate base case and water cut base case are compared to the predicted oil rate and the predicted water cut over time. The comparison illustrates that water cut would increase from 40% to 73% in 10 years and the oil rate would decrease significantly in the next 5 years without using ICVs in the well.

The base case was included the proactive optimization process that changes the valve settings over time to maximize the oil recovery factor in 10 years while minimizing the cumulative water. Using the same base model but setting up the smart completion design in the 3D grid simulation model as described in reference to FIG. 2, five ICVs are used with 10 setting positions and their respective flow coefficients. The main variable for the optimizer is the valve setting over 10 years; the ICV setting is assumed to be changed every year.

Because there are more than 10^4 possible combinations for setting these five valves, the optimizer was set up to find the optimal solution for hundreds of simulation runs to reduce computing time. When the objective function is achieved and penalties are minimized, a global optimal point is determined as the best solution. The simulator tested different rates at a certain BHP, for example 1,950 STB/D (suggested from the reactive optimization process), 1820 STB/D (current or base case), and other rates down to 1,200 STB/D, and found that 1,950 and 1,820 STB/D do not improve oil recovery. The optimizer found that the best rate to maximize oil recovery is at 1,400 STB/D. The results are shown in FIG. 14. The oil rate is almost constant at 1,400 STB/D, while the water cut decreases by around 0.3 and 0.4, depending on the valve settings. The water cut profile is entirely controlled by the combination of these five valves.

Figure 15:
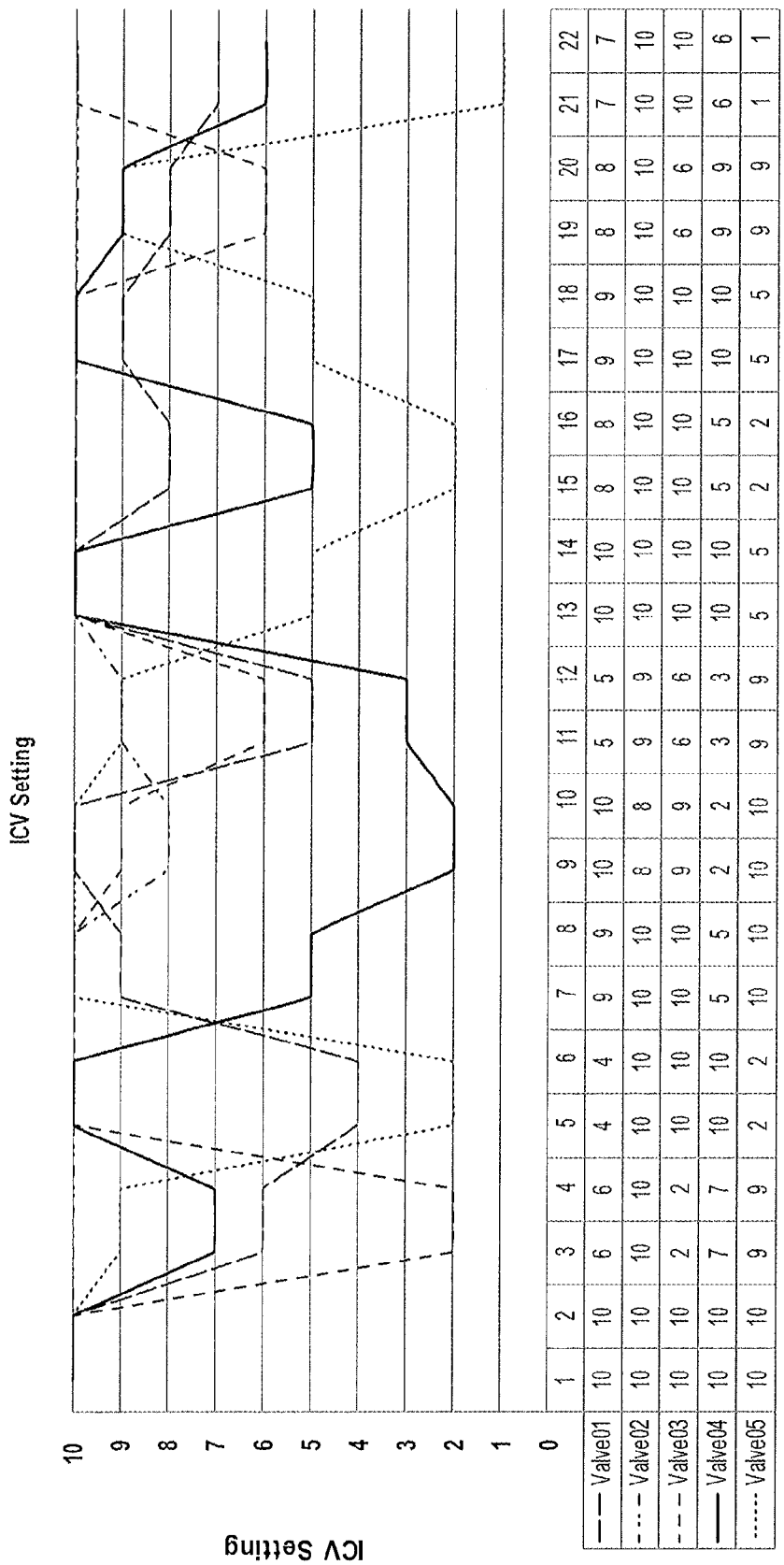
FIG. 15 is an exemplary ICV setting graph illustrating the best combination of ICV settings over time.

The best combination of ICV settings year by year is illustrated by the ICV setting graph in FIG. 15. The initial valve positions are set at 10. Valves do not change monotonically; in contrast, valves open and close depending on the best solution found by the optimizer to satisfy the objective function. Valve #2 does not exhibit large changes even though it is located in a region that can produce substantial water, which is also highly productive for oil. In contrast, because of high-permeability areas, valves 1, 3, 4, and 5 change every year. A reactive optimization approach suggests that the ICV setting for tomorrow should be 10×9× 6×9×10. In contrast, integrated reactive/proactive optimization, for year 3, suggests the ICV setting should be 6×10× 2×7×9 thus, significantly reducing the ICV-3 setting to 2.

Table 1 below confirms oil production is improved with integrated reactive/proactive optimization, as previously demonstrated, by installing five ICVs along the horizontal section of the well. Oil recovery is increased from 9,670 to 10,440 MSTB, which represents a 770 MSTB increment over 10 years. Water production is reduced from 5,050 to 4,120 MSTB. To optimize production, the ICV settings should be adjusted annually or even reviewed quarterly to keep a VRR around 0.75.

TABLE 1

| | Comparison | | |
| --- | --- | --- | --- |
| Cumulated Fluids | Reactive Case (initial rate 1,820 STB/D) | Integrated Case (initial rate 1,400 STB/D) | Difference, MSTB |
| Oil Production, MSTB | 9,670 | 10,440 | 770 (+8%) |
| Water Production, MSTB | 5,050 | 4,120 | (930) −18% |

System Description

The present disclosure may be implemented through a computer-executable program of instructions, such as program modules, generally referred to as software applications or application programs executed by a computer. The software may include, for example, routines, programs, objects, components, data structures, etc., that perform particular tasks or implement particular abstract data types. The software forms an interface to allow a computer to react according to a source of input. Nexus™ and NeTool™, which are commercial software applications marketed by Landmark Graphics Corporation, may be used as interface applications to implement the present disclosure. MATLAB™, which is a commercial software application marketed by MathWork, Inc. may also be used as interface application to implement the present disclosure. The software may also cooperate with other code segments to initiate a variety of tasks in response to data received in conjunction with the source of the received data. Other code segments may provide optimization components including, but not limited to, neural networks, earth modeling, history-matching, optimization, visualization, data management, reservoir simulation and economics. The software may be stored and/or carried on any variety of memory such as CD-ROM, magnetic disk, bubble memory and semiconductor memory (e.g., various types of RAM or ROM). Furthermore, the software and its results may be transmitted over a variety of carrier media such as optical fiber, metallic wire, and/or through any of a variety of networks, such as the Internet.

Moreover, those skilled in the art will appreciate that the disclosure may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof in a computer system or other processing system.

Referring now to FIG. 16, a block diagram illustrates one embodiment of a system for implementing the present disclosure on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the disclosure.

The memory primarily stores the application programs, which may also be described as program modules containing computer-executable instructions, executed by the computing unit for implementing the present disclosure described herein and illustrated in FIGS. 1-15. The memory therefore, includes an integrated optimization module, which enables steps 110, 114, 120, 122, 126, and 134 in FIGS. 1A-1C. The integrated optimization module may integrate functionality from the remaining application programs illustrated in FIG. 16. In particular, Nexus™ may be used as an interface application to perform steps 102, 130-134 and 138 in FIGS. 1A-1C. NeTool™ may be used as an interface application to perform steps 102-108, 112, 116, 118 and 124 in FIGS. 1A-1C and MATLAB™ may be used as an interface application to perform steps 104, 112, 124, 128 and 138 in FIGS. 1A-1C. Although Nexus™, NeTool™ and MATLAB™ may be used as interface applications, other interface applications may be used, instead, or the integrated optimization module may be used as a stand-alone application.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to and/or presently being operated on by the processing unit. By way of example, and not limitation, the computing unit includes an operating system, application programs, other program modules, and program data.

The components shown in the memory may also be included in other removable/non-removable, volatile/nonvolatile computer storage media or they may be implemented in the computing unit through an application program interface ("API") or cloud computing, which may reside on a separate computing unit connected through a computer system or network. For example only, a hard disk drive may read from or write to non-removable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/non-removable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, voice recognition or gesture recognition, or the like. These and other input devices are often connected to the processing unit through the client interface that is coupled to a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure defined by the appended claims and equivalents thereof.

The invention claimed is:

1. A method for optimizing oil recovery and reducing water production in a well, which comprises:
   a) calculating surface values for respective parameters of the well using static data for the well and at least one of dynamic data for the well and adjusted dynamic data for the well; said respective parameters of the well comprising at least one selected from the group consisting of well productivity index, water and oil flow rates, flowing bottom hole pressure, water cut and gas-to-oil ratio; wherein the static data for the well comprises at least one selected from the group consisting of well trajectory, well log profiles, relative permeability curves, pressure, volume, temperature, completion, well connection in horizontal section, permeability, initial saturation along well connection in horizontal section, valve coefficient, valve position and skin factor; and wherein said dynamic data comprises at least one selected from the group consisting of average oil, water and gas saturations and bottom hole pressure for each well connection and average static pressure for the well;
   b) performing history matching to compare the calculated surface values with real-time surface values for the respective parameters and to produce a misfit representing a surface model;
   c) adjusting one or more values in the dynamic data, which represents the adjusted dynamic data, and repeating steps a)-c) until the misfit representing the surface model is ≤10% with respect to the real-time surface values;
   d) calculating an optimal downhole valve setting for each completion zone in the well using a 3D grid simulation model and at least one of the surface model and a downhole model;
   e) updating the 3D grid simulation model using the adjusted dynamic data and a current downhole valve setting for each completion zone in the well;
   f) calculating a cumulative oil value over a predetermined forecasted time period at a predetermined forecasted time interval using the updated 3D grid simulation model and the current downhole valve setting for each completion zone in the well;
   g) calculating a maximum cumulative oil value over the predetermined forecasted time period at the predetermined forecasted time interval using the updated 3D grid simulation model and a new optimal downhole valve setting for each completion zone in the well that is based on a simulation to maximize the cumulative oil value; and
   h) using one of the optimal downhole valve setting for each completion zone in the well and the new optimal downhole valve setting for each completion zone in the well, adjusting the current downhole valve setting for each completion zone in the well to optimize oil recovery and reduce water production in the well.

2. The method of claim 1, wherein the misfit represents a difference between the calculated surface values and the real-time surface values.

3. The method of claim 1, further comprising:
   i) calculating downhole values for respective parameters of the well using the static data and one of the dynamic data and the adjusted dynamic data;
   j) performing history matching to compare the calculated downhole values with downhole values for the respective parameters from production logging test data and to produce a misfit representing the downhole model; and
   k) adjusting the one or more values in the dynamic data, which represents the adjusted dynamic data, and repeating steps a)-k) until the misfit representing the downhole model is ≤10% of the calculated downhole value.

4. The method of claim 3, wherein the downhole values for the respective parameters of the well comprise values for a gas-to-oil ratio, water cut, and influx water and oil rates for each well connection.

5. The method of claim 3, wherein the misfit represents a difference between the calculated downhole values and the downhole values from the production logging test data.

6. The method of claim 1, wherein the adjusted dynamic data comprises values for water and gas saturations.

7. The method of claim 1, wherein the static data is data collected for a predetermined period of time.

8. The method of claim 1, wherein the dynamic data is real-time data collected for a predetermined interval of time that is averaged over the predetermined interval of time.

9. A non-transitory program carrier device tangibly carrying computer-executable instructions for optimizing oil recovery and reducing water production in a well, the instructions being executable to implement:
   a) calculating surface values for respective parameters of the well using static data for the well and one of dynamic data for the well and adjusted dynamic data for the well; said respective parameters of the well comprising at least one selected from the group consisting of well productivity index, water and oil flow rates, flowing bottom hole pressure, water cut and gas-to-oil ratio; wherein the static data for the well comprises at least one selected from the group consisting of well trajectory, well log profiles, relative permeability curves, pressure, volume, temperature, completion, well connection in horizontal section, permeability, initial saturation along well connection in horizontal section, valve coefficient, valve position and skin factor; and wherein said dynamic data comprises at least one selected from the group consisting of average oil, water and gas saturations and bottom hole pressure for each well connection and average static pressure for the well;
   b) performing history matching to compare the calculated surface values with real-time surface values for the respective parameters and to produce a misfit representing a surface model;
   c) adjusting one or more values in the dynamic data, which represents the adjusted dynamic data, and repeating steps a)-c) until the misfit representing the surface model is ≤10% with respect to the real-time surface values;
   d) calculating an optimal downhole valve setting for each completion zone in the well using a 3D simulation model and at least one of the surface model and a downhole model;
   e) updating the 3D grid simulation model using the adjusted dynamic data and a current downhole valve setting for each completion zone in the well;
   f) calculating a cumulative oil value over a predetermined forecasted time period at a predetermined forecasted time interval using the updated 3D grid simulation model and the current downhole valve setting for each completion zone in the well;

g) calculating a maximum cumulative oil value over the predetermined forecasted time period at the predetermined forecasted time interval using the updated 3D grid simulation model and a new optimal downhole valve setting for each completion zone in the well that is based on a simulation to maximize the cumulative oil value; and h) using one of the optimal downhole valve setting for each completion zone in the well and the new optimal downhole valve setting for each completion zone in the well, adjusting the current downhole valve setting for each completion zone in the well to optimize oil recovery and reduce water production in the well.

10. The program carrier device of claim 9, wherein the misfit represents a difference between the calculated surface values and the real-time surface values.

11. The program carrier device of claim 9, further comprising:

i) Calculating downhole values for respective parameters of the well using the static data and one of the dynamic data and the adjusted dynamic data;

j) performing history matching to compare the calculated downhole values with downhole values for the respective parameters from production logging test data and to produce a misfit representing the downhole model; and k) adjusting the one or more values in the dynamic data, which represents the adjusted dynamic data, and repeating steps a)-k) until the misfit representing the downhole model is ≤ 10% of the calculated downhole value.

12. The program carrier device of claim 11, wherein the downhole values for the respective parameters of the well comprise values for a gas-to-oil ratio, water cut, and influx water and oil rates for each well connection.

13. The program carrier device of claim 11, wherein the misfit represents a difference between the calculated downhole values and the downhole values from the production logging test data.

14. The program carrier device of claim 9, wherein the adjusted dynamic data comprises values for water and gas saturations.

15. The program carrier device of claim 9, wherein the static data is data collected for a predetermined period in time.

16. The program carrier device of claim 9, wherein the dynamic data is real-time data collected for a predetermined interval of time that is averaged over the predetermined interval of time.

17. A non-transitory program carrier device tangibly carrying computer-executable instructions for optimizing oil recovery and reducing water production in a well, the instructions being executable to implement:

a) calculating surface values for respective parameters of the well using static data for the well and one of dynamic data for the well and adjusted dynamic data for the well; said respective parameters of the well comprising at least one selected from the group consisting of well productivity index, water and oil flow rates, flowing bottom hole pressure, water cut and gas-to-oil ratio; wherein the static data for the well comprises at least one selected from the group consisting of well trajectory, well log profiles, relative permeability curves, pressure, volume, temperature, completion, well connection in horizontal section, permeability, initial saturation along well connection in horizontal section, valve coefficient, valve position and skin factor; and wherein said dynamic data comprises at least one selected from the group consisting of average oil, water and gas saturations and bottom hole pressure for each well connection and average static pressure for the well;

b) performing history matching to compare the calculated surface values with real-time surface values for the respective parameters and to produce a misfit representing a surface model;

c) adjusting one or more values in the dynamic data, which represents the adjusted dynamic data, and repeating steps a)-c) until the misfit representing the surface model is ≤ 10% with respect to the real-time surface values;

d) calculating an optimal downhole valve setting for each completion zone in the well using a 3D simulation model and at least one of the surface model and a downhole model;

e) updating the 3D grid simulation model using the adjusted dynamic data and a current downhole valve setting for each completion zone in the well;

f) calculating a cumulative oil value over a predetermined forecasted time period at a predetermined forecasted time interval using the updated 3D grid simulation model and the current downhole valve setting for each completion zone in the well; and g) calculating a maximum cumulative oil value over the predetermined forecasted time period at the predetermined forecasted time interval using the updated 3D grid simulation model and a new optimal downhole valve setting for each completion zone in the well that is based on a simulation to maximize the cumulative oil value; and h) using one of the optimal downhole valve setting for each completion zone in the well and the new optimal downhole valve setting for each completion zone in the well, adjusting the current downhole valve setting for each completion zone in the well to optimize oil recovery and reduce water production in the well.

18. The program carrier device of claim 17, wherein the misfit represents a difference between the calculated surface values and the real-time surface values.

* * * * *